United States Patent
Song et al.

(10) Patent No.: US 9,075,244 B2
(45) Date of Patent: Jul. 7, 2015

(54) STEREOSCOPIC IMAGE DISPLAY DEVICE

(75) Inventors: Moohyoung Song, Daegu (KR); JooHong Lee, Seoul (KR); SeoungJin Park, Paju-si (KR); SungJin Hong, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 249 days.

(21) Appl. No.: 13/568,984

(22) Filed: Aug. 7, 2012

(65) Prior Publication Data
US 2013/0076704 A1 Mar. 28, 2013

(30) Foreign Application Priority Data
Sep. 22, 2011 (KR) .................. 10-2011-0095732

(51) Int. Cl.
| | |
|---|---|
| G09G 3/36 | (2006.01) |
| G02B 27/26 | (2006.01) |
| G02F 1/1335 | (2006.01) |
| G02F 1/133 | (2006.01) |
| H05K 7/14 | (2006.01) |
| G02B 27/22 | (2006.01) |

(Continued)

(52) U.S. Cl.
CPC .............. *G02B 27/26* (2013.01); *G02F 1/1335* (2013.01); *H05K 5/0204* (2013.01); *G02F 1/133* (2013.01); *H05K 7/14* (2013.01); *G02F 1/1333* (2013.01); *H05K 5/03* (2013.01); *G02B 27/22* (2013.01); *H04N 13/0436* (2013.01); *H05K 5/0217* (2013.01); *G02F 1/13* (2013.01); *H05K 5/069* (2013.01); *H04N 13/0003* (2013.01); *G09G 3/36* (2013.01); *H04N 13/0404* (2013.01); *H04N 13/0434* (2013.01); *H04N 2213/001* (2013.01); *G09G 3/004* (2013.01); *G09G 2300/0426* (2013.01); *G02F 1/133308* (2013.01); *G02F 1/13452* (2013.01); *G02F 1/1347* (2013.01)

(58) Field of Classification Search
USPC ............ 361/679.01–679.29; 359/56; 206/736
See application file for complete search history.

(56) References Cited

U.S. PATENT DOCUMENTS

| | | | |
|---|---|---|---|
| 8,599,322 B2* | 12/2013 | Ahn et al. ................... 349/15 |
| 2003/0107805 A1* | 6/2003 | Street ...................... 359/464 |

(Continued)

FOREIGN PATENT DOCUMENTS

| | | |
|---|---|---|
| CN | 101755451 A | 6/2010 |
| CN | 201765418 U | 3/2011 |

(Continued)

OTHER PUBLICATIONS

Office Action issued in Chinese Patent Application No. 201210277939.3, mailed Dec. 3, 2014, 8 pages.

*Primary Examiner* — Linh N Hoffner
(74) *Attorney, Agent, or Firm* — Brinks Gilson & Lione

(57) ABSTRACT

Disclosed is a stereoscopic image display device which has a thin thickness and an enhanced aesthetic appearance. The stereoscopic image display device includes an image display panel, a 3D optical panel, and a panel support member. The image display panel temporally or spatially divides and displays a left-eye image and a right-eye image. The 3D optical panel is coupled to the image display panel, and divides the left-eye image and the right-eye image. The panel support member is coupled to the image display panel with an adhesive member to surround the image display panel. The 3D optical panel is supported by the panel support member such that the upper surface and the side surface of the 3D optical panel are exposed to the outside of the stereoscopic image display device.

20 Claims, 11 Drawing Sheets

(51) Int. Cl.
*H04N 13/04* (2006.01)
*G02F 1/13* (2006.01)
*H04N 13/00* (2006.01)
*G02F 1/1345* (2006.01)
*G02F 1/1347* (2006.01)
*H05K 5/02* (2006.01)
*G02F 1/1333* (2006.01)
*H05K 5/03* (2006.01)
*H05K 5/06* (2006.01)
*G09G 3/00* (2006.01)

(56) References Cited

U.S. PATENT DOCUMENTS

| | | | |
|---|---|---|---|
| 2005/0285997 A1* | 12/2005 | Koyama et al. | 349/117 |
| 2007/0002211 A1* | 1/2007 | Sasaki et al. | 349/64 |
| 2007/0019119 A1* | 1/2007 | Tanaka et al. | 349/15 |
| 2008/0298001 A1* | 12/2008 | Choi | 361/681 |
| 2010/0053499 A1* | 3/2010 | Sasaki | 349/62 |
| 2010/0053749 A1* | 3/2010 | Yun et al. | 359/464 |
| 2010/0315570 A1* | 12/2010 | Mathew et al. | 349/58 |
| 2011/0242742 A1* | 10/2011 | Kim et al. | 361/679.01 |
| 2012/0026433 A1* | 2/2012 | Lee et al. | 349/96 |
| 2012/0281158 A1 | 11/2012 | Chen et al. | |

FOREIGN PATENT DOCUMENTS

| | | |
|---|---|---|
| CN | 102096222 A | 6/2011 |
| CN | 102269887 A | 12/2011 |
| JP | 2005-077551 | 3/2005 |

* cited by examiner

STEREOSCOPIC IMAGE DISPLAY DEVICE

CROSS-REFERENCE TO RELATED APPLICATIONS

This application claims the benefit of the Korean Patent Application No. 10-2011-0095732 filed on Sep. 22, 2011, which is hereby incorporated by reference as if fully set forth herein.

BACKGROUND

1. Field of the Disclosure

The present disclosure relates to a stereoscopic image display device, and more particularly, to a stereoscopic image display device which has a thin thickness and an enhanced aesthetic appearance.

2. Discussion of the Related Art

Generally, stereoscopic images that represent three-dimensionality are realized based on the stereo visual principle of binocular parallax, and the binocular parallax caused by the distance between two eyes is a key factor for three-dimensionality. That is, when left and right eyes watch different Two-Dimensional (2D) images and the different 2D images are delivered to the brain through the retina, the brain will merge the 2D images to reproduce a deep sense and realistic sense of the original Three-Dimensional (3D) image. Such a function is generally referred to as stereography, and a display device based on the stereography is called a stereoscopic image display device.

Such stereoscopic image display devices are classified into active (liquid crystal shutter) type display devices in which a left-eye image and a right-eye image are temporally divided to realize a 3D image, and retarder (polarized glasses) type display devices in which a left-eye image and a right-eye image are spatially divided to realize a 3D image.

A stereoscopic image display device comprising a display panel and a 3D panel to which both the active type and the retarder type are applied in combination, has been proposed recently.

FIG. 1 is a sectional view schematically illustrating a related art stereoscopic image display device.

Referring to FIG. 1, the related art stereoscopic image display device includes an image display panel 10, a display panel driver 20, a front case 30, a 3D optical panel 40, an optical panel driver 50, and a front set cover 60.

The image display panel 10 displays a 2D image or a stereoscopic image according to an image signal applied from the display panel driver 20. Hereinafter, the image display panel 10 will be described on the assumption that a stereoscopic image, namely, a left-eye image and a right-eye image are divided temporally or spatially and displayed. For this end, the image display panel 10 includes a first substrate 12 and a second substrate 14 that face each other and are coupled to each other.

The first substrate 12 includes a plurality of gate lines and data lines that are formed to be intersected and thereby define a plurality of pixel areas, a plurality of thin film transistors that are respectively connected to the gate lines and respectively connected to the data lines, and a plurality of pixel electrodes that are respectively formed in the pixel areas and to be connected to the respective thin film transistors. Further, a display panel pad part is prepared at one side of the first substrate 12 to connect to the gate lines and data lines. A lower polarizing film 12a is adhered to a lower surface of the first substrate 12.

The second substrate 14 is formed to have an area smaller than that of the first substrate 12 such that part of the first substrate 12, namely the display panel pad part, is exposed when the first and the second substrates 12 and 14 are coupled to each other. An upper polarizing film 14a is adhered to an upper surface of the second substrate 14.

The display panel driver 20 is connected to the display panel pad part of the first substrate 12 to supply a gate signal to the gate lines, and supply a left-eye image signal and a right-eye image signal to the data lines in synchronization with the supply of the gate signal.

The front case 30 is provided to cover a peripheral area of the image display panel 10 other than an active area of the image display panel 10. That is, the front case 30 surrounds the peripheral area of the image display panel 10 where the display panel pad part is prepared and the other peripheral areas of the image display panel 10.

The 3D optical panel 40 is configured to divide a left-eye image and a right-eye image, which are displayed on the image display panel 10, to realize a stereoscopic image, in synchronization with the driving of each pixel performed by the display panel driver 20. For this end, the 3D optical panel 40 includes a lower substrate 42 and an upper substrate 44 that are coupled to each other with a liquid crystal layer (not shown) disposed therebetween.

The lower substrate 42 includes a plurality of transparent electrode lines that are formed in correspondence with the respective pixel areas. A 3D panel pad part is prepared at one side of the lower substrate 42 such that an optical panel driver 50 for driving the transparent electrode lines is connected thereto.

The upper substrate 44 includes a transparent electrode layer to overlap with the plurality of first transparent electrode lines.

The optical panel driver 50 is connected to the 3D panel pad part of the lower substrate 42 and applies a plurality of liquid crystal driving signals to the respective transparent electrode lines, and a reference voltage (or common voltage) to the transparent electrode layer.

The 3D optical panel 40 operates the liquid crystal layer for dividing an image according to the liquid crystal driving signals that are respectively applied from the optical panel driver 50 to the transparent electrode lines, and thus divides a left-eye image and a right-eye image that are displayed on the image display panel 10 to realize a stereoscopic image.

The front set cover 60 surrounds both a side of the front case 30 and a front peripheral area of the 3D optical panel 40 other than the area of the 3D optical panel 40 that is overlapped with the active area of the image display panel 10, thereby acting as a set cover of the stereoscopic image display device.

Since the related art stereoscopic image display device includes the front set cover 60 that surrounds the side of the front case 30 and the front peripheral area of the 3D optical panel 40, the thickness and Bezel width of the display device increase due to the front set cover 60, and thus, the aesthetic appearance of the display device is degraded. Also, the aesthetic appearance of the front is degraded due to a step height between the front surface of the front set cover 60 and that of the 3D optical panel 40.

SUMMARY

A stereoscopic image display device, comprises: an image display panel temporally or spatially dividing and displaying a left-eye image and a right-eye image; a 3D optical panel coupled to the image display panel, and dividing the left-eye image and the right-eye image; and a panel support member coupled to the image display panel with an adhesive member to surround the image display panel, wherein the 3D optical panel is supported by the panel support member such that the upper surface of the 3D optical panel is exposed to the outside of the stereoscopic image display device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the written description serve to explain the principle of the invention. In the drawings.

DETAILED DESCRIPTION OF THE EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

Hereinafter, the embodiments of the present invention will be described in detail with reference to the accompanying drawings.

Figure 1:
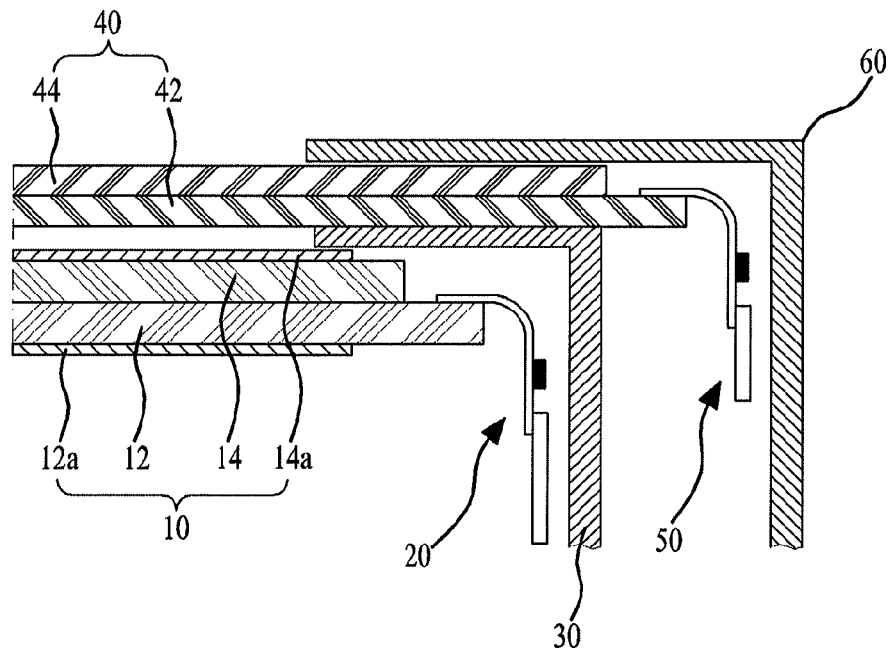
FIG. 1 is a sectional view schematically illustrating a related art stereoscopic image display device.
Figure 2:
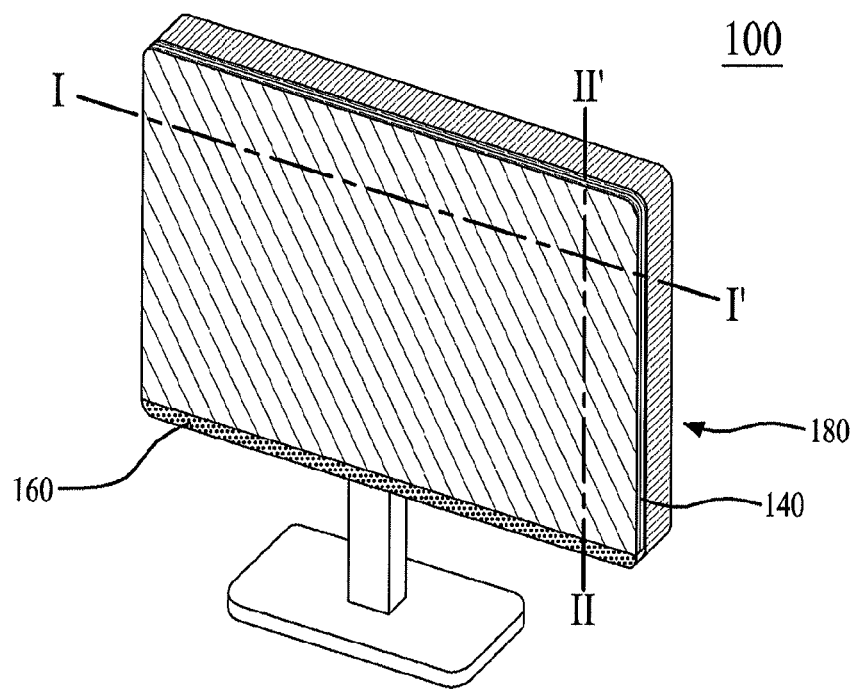
FIG. 2 is a view illustrating a stereoscopic image display device according to a first embodiment of the present invention.
Figure 3:
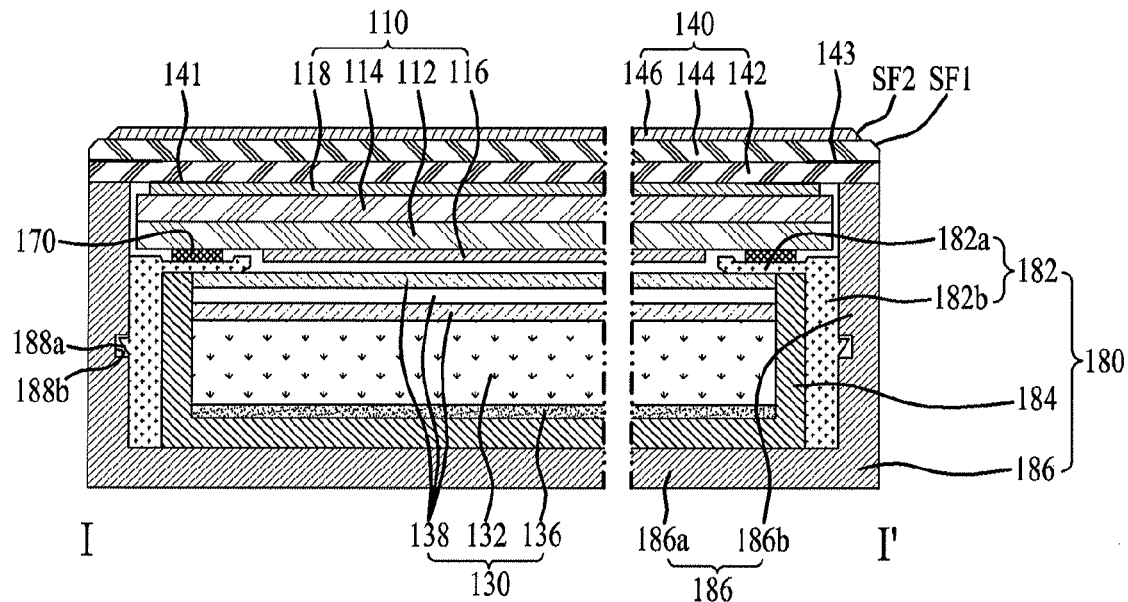
FIG. 3 is a sectional view taken along line I-I' of FIG. 2.
Figure 4:
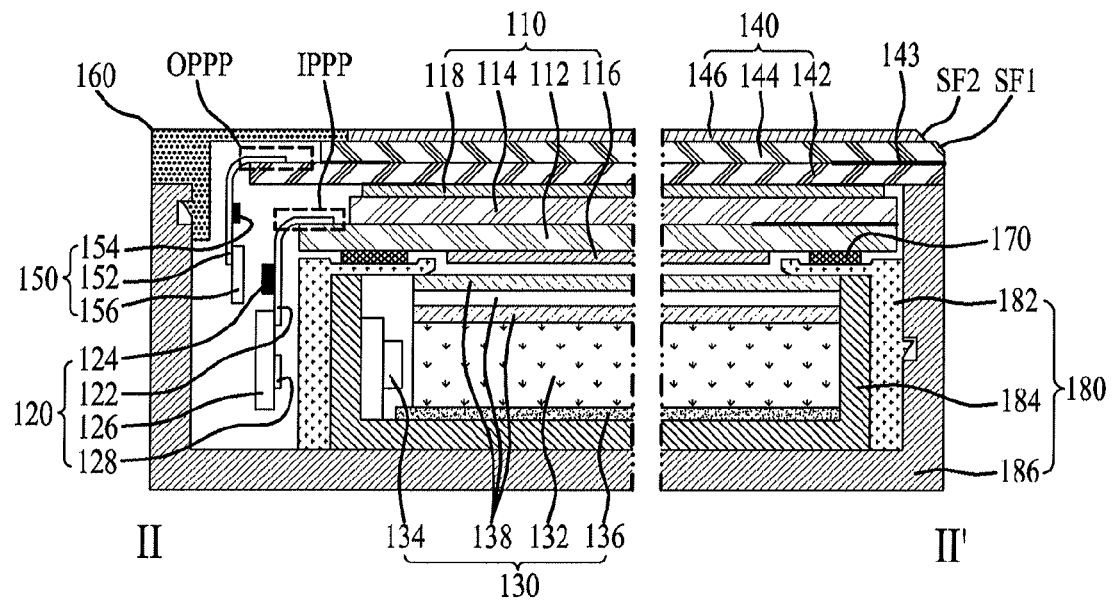
FIG. 4 is a sectional view taken along line II-II' of FIG. 2.

FIG. 2 is a view illustrating a stereoscopic image display device according to a first embodiment of the present invention. FIG. 3 is a sectional view taken along line I-I' of FIG. 2. FIG. 4 is a sectional view taken along line II-II' of FIG. 2.

Referring to FIGS. 2 to 4, a stereoscopic image display device 100 according to the first embodiment of the present invention includes: an image display panel 110 that displays a 2D image or a stereoscopic image according to an image signal applied from the display panel driver 120; a 3D optical panel 140 that is coupled to a top of the image display panel 110 and divides a left-eye image and a right-eye image; and a panel support member 180 that is coupled to the image display panel 110 with an adhesive member 170, for surrounding the image display panel 110, and supporting the 3D optical panel 140.

The image display panel 110 displays a 2D image or a stereoscopic image according to a display mode. Hereinafter, the image display panel 110 will be described on the assumption that a stereoscopic image, namely, a left-eye image and a right-eye image are divided temporally or spatially (for example, in units of a horizontal line or in units of a frame) and displayed. For this end, the image display panel 110 includes a first substrate 112 and a second substrate 114 that are coupled to each other with a liquid crystal layer (not shown) for image display disposed therebetween, a lower polarizing film 116 that is coupled to a lower surface of the first substrate 112, and an upper polarizing film 118 that is coupled to an upper surface of the second substrate 114.

The first substrate 112 is a thin film transistor array substrate, and includes a plurality of pixels (not shown) that are respectively formed in a plurality of areas which are defined by the intersection of a plurality of gate lines (not shown) and data lines (not shown). Each of the pixels may include a thin film transistor that is connected to a gate line and a data line, a pixel electrode that is connected to the thin film transistor and receives a data voltage, and a common electrode that is formed adjacently to the pixel electrode and receives a common voltage. Herein, the common electrode may be formed at the second substrate 114 according to a driving scheme of the liquid crystal layer for image display. An electric field corresponding to a difference voltage between the data voltage and the common voltage is generated in the first substrate 112, thereby adjusting a light transmittance of the liquid crystal layer for image display.

A display panel pad part IPPP connected to each gate line and each data line is prepared at an edge portion of a lower side of the first substrate 112, and a display panel driver 120 is connected to the display panel pad part IPPP. Also, a gate driving circuit (not shown) for supplying a gate (scan) signal to the image display panel 110 is formed in at least one side portion of the first substrate 112, through the thin film transistor manufacturing process. For example, the gate driving circuit may be formed in a short side left portion and/or a short side right portion of the first substrate 112.

The display panel driver 120 is connected to the display panel pad part IPPP supplies a gate signal to a gate line of the image display panel 110, and supplies a left-eye image signal and a right-eye image signal to respective data lines in synchronization with the supply of the gate signal. In this case, the left-eye image signal and the right-eye image signal may be divided temporally or spatially (for example, in units of a horizontal line or in units of a frame) and supplied. For this end, the display panel driver 120 includes a plurality of circuit films 122 that are coupled to the display panel pad part IPPP, a data driving Integrated Circuit (IC) 124 that is mounted on each of the circuit films 122, a first Printed Circuit Board (PCB) 126 that is coupled to the circuit films 122, and a display panel driving circuit 128 that is mounted on the first PCB 126.

Each of the circuit films 122 may be adhered to the display panel pad part IPPP and the first PCB 126 by a Tape Automated Bonding (TAB) process, and may be a Tape Carrier Package (TCP) or Chip On Flexible Board/Chip On Film (COF). Each of the circuit films 122 is configured to have a curved shape to surround one side of the image display panel 110 such that the data driving IC 124 and the first PCB 126 are disposed at a side of the image display panel 110 and are placed inside the panel support member 180.

The data driving IC 124 is mounted on each of the circuit films 122, and supplies a plurality of data signals, which are supplied from the display panel driving circuit 128 through the first PCB 126, to the respective data lines of the image display panel 110.

The first PCB 126 is electrically connected to each of the circuit films 122, and supplies various signals necessary for displaying an image to the image display panel 110.

The display panel driving circuit 128 is mounted on the first PCB 126, and drives the data driving IC 124 and the gate driving circuit (not shown). For this end, the display panel driving circuit 128 includes a timing controller (not shown) that controls the driving of the data driving IC 124 and the gate driving circuit (not shown), various power source circuits (not shown), and a memory (not shown). The display panel driving circuit 128 generates left-eye image data and right-eye image data on the basis of digital data that are supplied from the outside, divides the left-eye image data and the right-eye image data temporally or spatially, and displays the divided image data on the image display panel 110.

The display panel pad part IPPP and the display panel driver 120 are arranged at a lower side of the image display panel 110 along the direction of the thickness of the display device 100, and are not covered by the second substrate 114, however covered by the 3D optical panel 140.

The second substrate 114 is a color filter array substrate, and includes a plurality of color filters corresponding to the respective pixels that are formed at the first substrate 112. Herein, a common electrode that receives a common voltage may be formed at the second substrate 114, according to the driving scheme of the liquid crystal layer for image display. The second substrate 114 filters light which is incident through the liquid crystal layer for image display to output color light to the outside by using the color filters, thereby allowing a color image to be displayed on the image display panel 110. The second substrate 114 covers the first substrate 112 except the edge portion of the lower side of the first substrate 112 where the display panel pad part IPPP is prepared and at which the display panel driver 120 is located, and has a size smaller than that of the first substrate 112 by the edge portion of the lower side of the first substrate 112.

Herein, the lower substrate 112 and the upper substrate 114 may have different structures, depending on a driving mode of the liquid crystal layer for image display, for example, a Twisted Nematic (TN) mode, a Vertical Alignment (VA) mode, an In-Plane switching (IPS) mode, or a Fringe Field Switching (FFS) mode.

The lower polarizing film 116 is adhered to a lower surface of the first substrate 112 and polarizes light that is irradiated from a backlight unit 130 onto the image display panel 110.

The upper polarizing film 118 is adhered to an upper surface of the second substrate 114 and polarizes light that is emitted to the outside through the second substrate 114.

The backlight unit 130 is placed in the panel support member 180, and irradiates light onto the image display panel 110. For this end, the backlight unit 130 includes a light source 134, a light guide panel 132, a reflective sheet 136, and an optical sheet member 138.

The light guide panel 132 is formed in a flat type (or a wedge type) and guides light emitted from the light source 134 to the image display panel 110.

The light source 134 is disposed to face a light incident surface through which the light emitted from the light source 134 comes into the light guide panel 132. At least one side surface of the light guide panel 132 can be used as the light incident surface. Herein, the light source 134 may include a fluorescent lamp or a Light Emitting Diode (LED).

The reflective sheet 136 is disposed at a bottom of the light guide panel 132 to reflect the light, which is incident thereon from the light guide panel 132, to the image display panel 110. The reflective sheet 136 may be formed to surround other side surfaces of the light guide panel 132 other than the one which is used as the light incident surface.

The optical sheet member 138 is disposed on the light guide panel 132 and enhances the luminance characteristic of light traveling from the light guide panel 132 to the image display panel 110. For this end, the optical sheet member 138 may include at least one diffusive sheet and at least one prism sheet.

The backlight unit 130 irradiates conformal light on an entire rear area of the image display panel 110. Therefore, the image display panel 110 drives the liquid crystal layer according to a left-eye image and a right-eye image that are divided temporally or spatially and supplied by the display panel driver 120, and adjusts a transmittance of light that is irradiated from the backlight unit 130 according to the driving of the liquid crystal layer for image display, thereby displaying a stereoscopic image.

The 3D optical panel 140 divides light for the left-eye image and light for the right-eye image that are displayed and inputted by the image display panel 110 according to a liquid crystal driving signal.

Figure 5A:
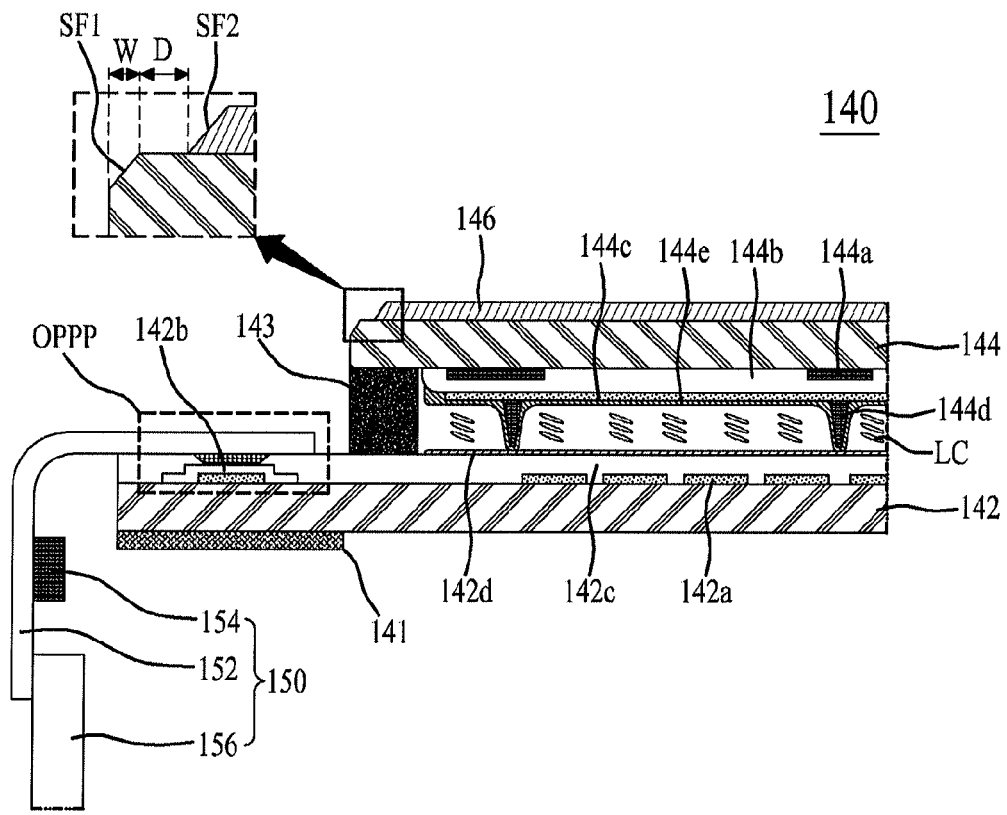
FIGS. 5A and 5B are views for describing various embodiments of a 3D optical panel of FIGS. 3 and 4.

The 3D optical panel 140 according to an embodiment, as illustrated in FIG. 5A, includes a lower substrate 142 and an upper substrate 144 that face each other and are coupled to each other with a liquid crystal layer LC for image division therebetween. The 3D optical panel 140 further includes a polarization conversion member 146 disposed on an upper surface of the upper substrate 144.

The lower substrate 142 is formed to have an area larger than that of the image display panel 110, and adhered to an upper surface of the image display panel 110 with a panel coupling member 141. In this case, the panel coupling member 141 may be a double-sided tape, a thermosetting adhesive, or a photocurable adhesive that is disposed at a lower surface of the lower substrate 142 and to be overlapped with an edge portion of an upper surface of the upper polarizing film 118 of the image display panel 110. Herein, when the panel coupling member 141 is a transparent thermosetting adhesive or a transparent photocurable adhesive, the panel coupling member 141 may be disposed at an entire lower surface of the lower substrate 142 to enhance a coupling strength.

The lower substrate 142 includes a plurality of transparent electrode lines 142a, a plurality of pad electrodes 142b, a lower insulation layer 142c, and a lower alignment layer 142d.

Each of the transparent electrode lines 142a is formed on the lower substrate 142 in corresponding to a pixel area of the image display panel 110. Each of the transparent electrode lines 142a allows an electric field to be generated in the liquid crystal layer LC for image division and thus the liquid crystal layer LC for image division can be driven according to a plurality of liquid crystal driving signals that are respectively supplied through the pad electrodes 142b.

Each of the pad electrodes 142b is formed on the lower substrate 142 to overlap with an optical panel pad part OPPP that is prepared at an edge portion of a lower side of the lower substrate 142, and electrically connected to a corresponding transparent electrode line 142a. The pad electrodes 142b are connected to an optical panel driver 150 which will be described later, and supply the liquid crystal driving signals, which are supplied from the optical panel driver 150, to the transparent electrode lines 142a, respectively.

The lower insulation layer 142c is formed on the lower substrate 142 to cover the transparent electrode lines 142a and the pad electrodes 142b.

The lower alignment layer 142d is formed on the lower insulation layer 142c to allow liquid crystal molecules of the liquid crystal layer LC for image division to be aligned (oriented) in a certain direction.

In response to an optical panel control signal that is supplied from the display panel driving circuit 128 of the display panel driver 120, the optical panel driver 150 generates a plurality of liquid crystal driving signals and supplies the liquid crystal driving signals respectively to pad electrodes 142b that are formed at the optical panel pad part OPPP. For this end, the optical panel driver 150 includes: a plurality of flexible circuit films 152 that are coupled to the optical panel pad part OPPP; a driving IC 154 that is mounted on each of the flexible circuit films 152; and a second PCB 156 that is coupled to the flexible circuit films 152.

Each of the flexible circuit films 152 may be adhered to the optical panel pad part OPPP and the second PCB 156 by a TAB process, and may be a TCP or a COF. Each of the flexible circuit films 152 is configured to have a curved shape to surround one side of the image display panel 110 having the display panel driver 120 connected thereto such that the driving IC 154 and the second PCB 156 are disposed at that side of the image display panel 110 and are placed inside the panel support member 180.

The driving IC 154 is mounted on each of the flexible circuit films 152. In response to the optical panel control signal that is supplied from the display panel driving circuit 128 through the second PCB 156, the driving IC 154 generates the liquid crystal driving signals and supplies the liquid crystal driving signals to the respective transparent electrode lines 142a of the lower substrate 142.

The second PCB 156 is electrically connected to each of the flexible circuit films 152. The second PCB 156 is connected to the first PCB 126 through a signal cable (not shown) and supplies the optical panel control signal, which is output from the display panel driving circuit 128, to the driving IC 154 through the flexible circuit films 152.

The upper substrate 144 is formed to cover the lower substrate 142 except the edge portion of the lower side of the lower substrate 142 where the optical panel pad part OPPP is prepared and at which the optical panel driver 150 is located, and has a size smaller than that of the lower substrate 142 by the edge portion of the lower side of the lower substrate 142. The upper substrate 144 includes a light blocking pattern 144a, an upper insulation layer 144b, a transparent electrode layer 144c, a plurality of gap maintaining members 144d, and an upper alignment layer 114e.

The light blocking pattern 144a is formed at the upper substrate 144 to define an opening area corresponding to each pixel area of the image display panel 110.

The upper insulation layer 144b is formed on an entire surface of the upper substrate 144 to cover the light blocking pattern 144a.

The transparent electrode layer 144c is formed on the upper insulation layer 144b to overlap with the transparent electrode lines 142a that are formed at the lower substrate 142. A reference voltage for driving the liquid crystal layer LC for image division is supplied to the transparent electrode layer 144c.

The gap maintaining members 144d are formed on the transparent electrode layer 144c at certain intervals to have a certain height, so as to maintain a constant cell gap between the lower substrate 142 and the upper substrate 144.

The upper alignment layer 144e is formed to cover the gap maintaining members 144d and the transparent electrode layer 144c, and allows liquid crystal molecules of the liquid crystal layer LC for image division to be aligned (oriented) in a certain direction.

The lower substrate 142 and the upper substrate 144 of the 3D optical panel 140 according to another embodiment of the present invention are coupled to each other by a sealing member 143 that is formed at an edge portion of the lower surface of the upper substrate 144, with the liquid crystal layer LC for image division disposed therebetween.

The liquid crystal layer LC for image division is filled in the gap maintained between the lower substrate 142 and the upper substrate 144 by the gap maintaining members 144d formed at the upper substrate 144. In this case, the liquid crystal molecules of the liquid crystal layer LC for image division are aligned (oriented) in a certain direction by the lower alignment layer 142d and the upper alignment layer 144e. The liquid crystal layer LC for image division is driven according to the liquid crystal driving signals which are respectively applied to the transparent electrode lines 142a and the reference voltage which is applied to the transparent electrode layer 144c, thereby dividing a left-eye image and a right-eye image. For example, the liquid crystal layer LC for image division changes light for a left-eye image and light for a right-eye image, which are incident thereon according to the liquid crystal driving signals, respectively, to left linear polarized light and right linear polarized light, thereby dividing the left-eye image and the right-eye image. For this end, the liquid crystal layer LC for image division is driven in a liquid crystal mode having a phase difference of $\lambda/2$, which may be Twisted Nematic (TN), Vertical Alignment (VA), Optical Compensated Bend (OCB), or Electrically Controlled Birefringence (ECB). Specifically, the liquid crystal mode may be the OCB liquid crystal mode or the ECB liquid crystal mode.

The polarization conversion member 146 is disposed on an upper surface of the upper substrate 144, and converts left linear polarized light or right linear polarized light, which is divided and input by the liquid crystal layer LC for image division, into different polarized light. For this end, the polarization conversion member 146 may be a $\lambda/4$ wavelength plate having a phase difference of $\lambda/4$. For example, the polarization conversion member 146 may convert left linear polarized light, which is incident thereon by the liquid crystal layer LC for image division, into right circular polarized light.

In this way, a left-eye image presented by the light that has been left circular polarized by the polarization conversion member 146 is transferred to a viewer's left eye through 3D glasses having a circular polarization type, and a right-eye image presented by the light that has been right circular polarized by the polarization conversion member 146 is transferred to a viewer's right eye through the 3D glasses.

When 3D glasses have a linear polarization type, the polarization conversion member 146 may be omitted.

In the 3D optical panel 140, the optical panel pad part OPPP and the optical panel driver 150 are arranged at a lower side of the 3D optical panel 140 along the direction of the thickness of the display device 100, and exposed to the outside without being covered by the upper substrate 144. Therefore, the stereoscopic image display device 100 according to the first embodiment of the present invention may further include a deco cover 160 that covers an upper portion and a side of that lower side of the 3D optical panel 140 to prevent the optical panel pad part OPPP and the optical panel driver 150 from being exposed to the outside.

The deco cover 160 is formed to have a cross section of "┌" shape, and is coupled to the panel support member 180 to cover the edge portion of that lower side of the 3D optical panel 140, thus preventing the optical panel pad part OPPP and the optical panel driver 150 from being exposed to the outside of the stereoscopic image display device. In this case, the deco cover 160 may be formed to cover an upper edge portion of the upper substrate 144 in such a way as to contact the side surface of the polarization conversion member 146 which is adjacent to the optical panel pad part OPPP, without covering the upper surface of the polarization conversion member 146, thereby enhancing the aesthetic appearance of the stereoscopic image display device 100.

A top and side surfaces of the 3D optical panel 140 other than a portion of the 3D optical panel 140 covered by the deco cover 160 are exposed to the outside of the stereoscopic image display device. Therefore, since the top and side surfaces of the 3D optical panel 140 are exposed to the outside of the stereoscopic image display device, a front set cover (or Bezel) configuring a front border portion of the 3D optical panel 140 can be removed, and a step height of the border portion can be removed, thus enhancing the aesthetic appearance of the stereoscopic image display device 100 in terms of design. In this case, a side surface of the 3D optical panel 140 is exposed to the outside of the stereoscopic image display device, and thus, the polarization conversion member 146 adhered to the upper substrate 144 may be partially detached by a user's contact. To solve this problem, except for the lower side surface of the 3D optical panel 140 covered by the deco cover 160, all other side surfaces including the left, right and upper side surfaces of the polarization conversion member 146 and the upper substrate 144 can be processed to have first and second slope faces SF1 and SF2 with a certain slope, and each corner portion of the 3D optical panel 140 is rounded to have a certain curvature.

The first slope face SF1 is formed at the left, right and upper side surfaces of the upper substrate 144, and processed to have a first slope by a processing process such as a chamfer process. In this case, a width W of the first slope face SF1 may be about 250 μm to about 400 μm from a side of the upper substrate 144. The width W of the first slope face SF1 is optimal for enhancing the aesthetic appearance of the stereoscopic image display device 100, however it may be changed.

The second slope face SF2 is formed at the left, right and upper side surfaces of the polarization conversion member 146, and processed to have a second slope by a cutting process using a laser. In this case, a side surface of the polarization conversion member 146 having the second slope face SF2 may be separated from the corresponding side surface of the upper substrate 144 by a distance D which is within 800 μm. For example, when a side surface of the polarization conversion member 146 is matched with a side surface of the upper substrate 144, the polarization conversion member 146 can be partially detached by a user's contact, and when the side surface of the polarization conversion member 146 is separated from the side surface of the upper substrate 144 by a distance of more than 800 μm, the aesthetic appearance of the stereoscopic image display device 100 can be degraded.

The polarization conversion member 146 may be adhered to the upper substrate 144 by a film adhering process using a roller, in which case due to an adhesion tolerance, it is difficult to adhere the polarization conversion member 146 to the upper surface of the upper substrate 144 in order for the polarization conversion member 146 to be separated from the side surface of the upper substrate 144 by a distance of no more than 800 μm. Therefore, in the present embodiment, the polarization conversion member 146 having an area larger than that of the upper substrate 144 is adhered to the upper surface of the upper substrate 144 by the film adhering process using the roller, and then, by cutting the polarization conversion member 146 through the laser cutting process, the side surface of the polarization conversion member 146 is separated from the side surface of the upper substrate 144 by a distance of no more than 800 μm, in this case, the side surface of the polarization conversion member 146 is separated from the side surface of the upper substrate 144 by a distance D of less than 400 μm. Herein, in the film adhering process using the roller, the polarization conversion member 146 protrudes by a certain distance from a side surface other than one side portion of the upper substrate 144 adjacent to the optical panel pad part OPPP of the lower substrate 142. For example, the upper side, left side, and right side of the polarization conversion member 146 have a size larger than that of the upper substrate 144 by a certain distance, for example, about 2 mm.

Since the three side surfaces of the polarization conversion member 146 is fabricated to have the second slope face SF2 that is separated from the corresponding side surfaces of the upper substrate 144 by a distance D of less than 400 μm through the cutting process using the laser, the polarization conversion member 146 will not detached by a user's contact.

Figure 5B:
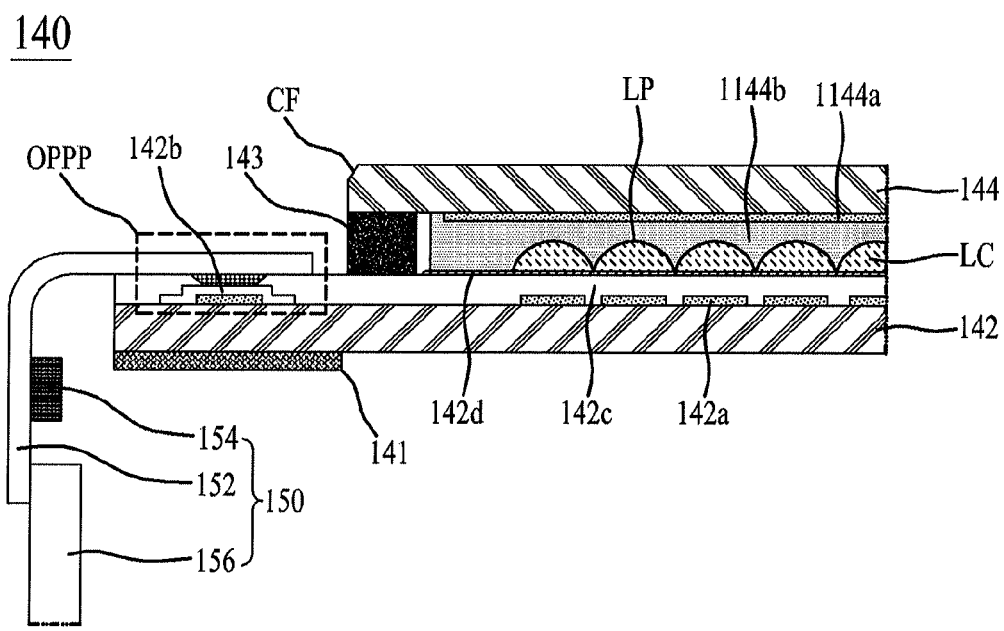

A 3D optical panel 140 according to another embodiment of the present invention, as illustrated in FIG. 5B, includes a lower substrate 142 and an upper substrate 144 that are coupled to each other with a liquid crystal layer LC for image division disposed therebetween.

The lower substrate 142 is formed to have an area larger than that of the image display panel 110, and adhered to an upper surface of the image display panel 110 with a panel coupling member 141. In this case, the panel coupling member 141 may be a double-sided tape, a thermosetting adhesive, or a photocurable adhesive that is disposed at an edge portion of a lower side of the lower surface of the lower substrate 142 and is overlapped with an edge portion of the corresponding side of the upper surface of the upper polarizing film 118 of the image display panel 110. The lower substrate 142 includes a plurality of transparent electrode lines 142a, a plurality of pad electrodes 142b, a lower insulation layer 142c, and a lower alignment layer 142d. The lower substrate 142 of the 3D optical panel 140 according to this embodiment is the same as the lower substrate 142 of the 3D optical panel 140 as described above with reference to FIG. 5A, and thus, for the sake of brevity, a repetitive description will not be made and like reference numerals refer to like elements.

The upper substrate 144 is formed to cover the lower substrate 142 except the edge portion of the lower side of the lower substrate 142 where an optical panel pad part OPPP is prepared and at which an optical panel driver 150 is located, and has a size smaller than that of the lower substrate 142 by the edge portion of the lower side of the lower substrate 142. The upper substrate 144 includes a transparent electrode layer 1144a and a lens pattern layer 1144b.

The transparent electrode layer 1144a is formed on the upper substrate 144. A reference voltage for driving the liquid crystal layer LC for image division is supplied to the transparent electrode layer 1144a.

The lens pattern layer 1144b is formed on the transparent electrode layer 1144a and includes a plurality of lens pattern grooves LP that are formed concavely to overlap with the respective transparent electrode lines 142a that are formed at the lower substrate 142.

Each of the lens pattern grooves LP may be formed to have a cross section of a concave shape, for example, a semicircular shape or an oval shape. Herein, the sectional width of each lens pattern groove LP is used for dividing a left-eye image and a right-eye image that are spatially divided and displayed on the image display panel 110, and can be determined according to the number of viewers in front of the image display panel 110.

A top and side surfaces of the 3D optical panel 140 except a portion of the 3D optical panel 140 covered by the deco cover 160 are exposed to the outside of the stereoscopic image display device. Therefore, since the top and side surfaces of the 3D optical panel 140 are exposed to the outside of the stereoscopic image display device, a front set cover (or Bezel) configuring a front border portion of the 3D optical panel 140 can be removed, and a step height of the border portion can be removed, thus enhancing the aesthetic appearance of the stereoscopic image display device 100 in terms of design. In this case, a side surface of the 3D optical panel 140 is exposed to the outside of the stereoscopic image display device, and thus, a user can be injured by each side surface and corner portion of the upper substrate 144. To solve this problem, except for the lower side surface of the 3D optical panel 140 covered by the deco cover 160, all other side surfaces including the left, right and upper side surfaces of the upper substrate 144 can be processed to have a slope face CF with a certain slope, and each corner portion of the 3D optical panel 140 is rounded to have a certain curvature.

The lower substrate 142 and upper substrate 144 of the 3D optical panel 140 according to this embodiment are coupled to each other by a sealing member 143 that is formed at an edge portion of the lower surface of the upper substrate 144.

The liquid crystal layer LC for image division is filled in each of the lens pattern grooves LP that is formed at the upper substrate 144. In this case, the liquid crystal molecules of the liquid crystal layer LC for image division are aligned (oriented) in a certain direction by the lower alignment layer 142d that is formed at the lower substrate 142. The liquid crystal layer LC for image division is driven according to a plurality of liquid crystal driving signals which are respectively applied to the transparent electrode lines 142a and the reference voltage which is applied to the transparent electrode layer 1144a, thereby dividing a left-eye image and a right-eye image.

The 3D optical panel 140 according to this embodiment divides a left-eye image and a right-eye image by using the lens pattern grooves LP, thereby providing a stereoscopic image to a viewer based on a glasses free type.

The 3D optical panel 140 is coupled to the panel support member 180 with the three side surfaces (i.e., the left side surface, the upper side surface and the right side surface) except the lower side surface that is covered by the deco cover 140 being exposed to the outside of the stereoscopic image display device. The 3D optical panel 140 drives the liquid crystal layer LC for image division and thus divides a left-eye image and a right-eye image according to the liquid crystal driving signals synchronized with the driving of the image display panel 110 that is placed in the panel support member 180, thereby providing a stereoscopic image to a viewer.

Referring again to FIGS. 2 to 4, the panel support member 180 is coupled to the image display panel 110 with the adhesive member 170, to surround the image display panel 110, and support the 3D optical panel 140. For this end, the panel support member 180 includes a guide frame 182, a support case 184, and a set cover 186.

The guide frame 182 is formed in a tetragonal frame shape to have a cross section of "⌐" shape. The guide frame 182 is supported by the support case 184 that is the guide frame 182 is coupled to the set cover 186, and is coupled to an edge portion of the lower surface of the image display panel 110 with the adhesive member 170. For this end, the guide frame 135 includes a panel coupling part 182a, and a guide side wall 182b that is bent vertically from the panel coupling part 182a and coupled to the set cover 186.

The panel coupling part 182a is formed in a plate shape to face the edge portion of the lower surface of the image display panel 110, and is coupled to the image display panel 110 with the adhesive member 170. Herein, the panel coupling part 182a includes an adhesive member forming groove that is formed to have a certain depth, and the adhesive member forming groove facilitates the formation of the adhesive member 170. The panel coupling part 182a is placed in the set cover 186 and is supported by the support case 184.

The guide side wall 182b is configured to have a curved shape that is bent vertically from an edge of the panel coupling part 182a to surround a side of the support case 184, and the guide side wall 182b is coupled to the set cover 186.

The adhesive member 170 is formed at the panel coupling part 182a of the guide frame 182 for coupling the image display panel 110 to the guide frame 182. Herein, the adhesive member 170 may be coupled to the first substrate 112 of the image display panel 110 to enhance a coupling strength and reduce thickness of the image display panel 110 and the guide frame 182, however, the present invention is not limited in this regard. As another example, the adhesive member 170 may be coupled to the lower polarizing film 116 of the image display panel 110. The adhesive member 170 may be a double-sided tape, a thermosetting adhesive, or a photocurable adhesive.

The support case 184 is formed in a U-shape to have a receiving space for receiving the backlight unit 120, and supports the guide frame 182. A side wall of the support case 184 supports the panel coupling part 182a of the guide frame 182, and is surrounded by the guide side wall 182b of the guide frame 182. The support case 184 may be omitted according to the designing and considering the slimming of the stereoscopic image display device 100.

The set cover 186 supports the support case 184 and the edge portion of the 3D optical panel 140, and surrounds the side surface of the image display panel 100 and the guide frame 182. The set cover 186 may be formed of a plastic material or a metal material, for example, The set cover 186 may be formed of a metal material for enhancing the aesthetic appearance of the produced stereoscopic image display device 100.

The set cover 186 includes a set plate 186a and a set side wall 186b.

The set plate 186a acts as a rear cover of the stereoscopic image display device. That is, the set plate 186a may become a rear cover of a display device such as a television or a notebook computer.

The set side wall 186b is configured to be bent vertically from an edge portion of the set plate 186a to surround the side surface of the image display panel 110 and the guide frame 182, and supports the bottom edge portion of the 3D optical panel 140. In this case, the set side wall 186b, which surrounds the guide frame 182 and the side surface of the image display panel 110, is exposed to outside of the stereoscopic image display device 100, and thus acts as a side cover of the stereoscopic image display device 100. That is, the set side wall 186b may become a side cover of a display device such as a television or a notebook computer.

One set side wall 186b among the four set side walls 186b of the set cover 186 is coupled to the deco cover 160 that covers the optical panel pad part OPPP and optical panel driver 150 of the 3D optical panel 140, as shown in FIG. 4. The outer side surface of the set side wall 186b coupled to the deco cover 160 is disposed on the same plane as that of the deco cover 160, so as not to be stepped with respect to the outer side surface of the 3D optical panel 140. Therefore, among the four outer side surfaces of the 3D optical panel 140, except for the outer side surface covered by the deco cover 160, three outer side surfaces of the 3D optical panel 140, i.e., the left outer side surface, the right outer side surface and the upper outer side surface of the 3D optical panel 140 are exposed to the outside of the stereoscopic image display device.

The panel support member 180 further includes a first coupling member 188a and a second coupling member 188b.

The first coupling member 188a is formed at the guide side wall 182b of the guide frame 182. The second coupling member 188b is formed at the set side wall 186b of the set cover 186. The first coupling member 188a and the second coupling member 188b are to be coupled to each other. For example, as shown in FIG. 3, the first coupling member 188a is a hook protrusion that protrudes from an outer surface of the guide side wall 182b, and the second coupling member 188b is a hook groove that is formed at an inner surface of the set side wall 186b, however, the present invention is not limited thereto. The first coupling member 188a may be a hook groove that that is formed at the outer surface of guide side wall 182b, and the second coupling member 188b may be a hook protrusion that protrudes from the inner surface of the set side wall 186b.

The guide frame 182 and the set cover 186 have been described above as being mutually coupled, however the present invention is not limited thereto. In terms of design of the stereoscopic image display device 100, the guide frame 182 may be coupled to the support case 184. For this, the set cover 186 may be coupled to the support case 184 by a plurality of screws that couple the set plate 186a to a bottom of the support case 184.

As described above, the stereoscopic image display device 100 according to the first embodiment of the present invention includes the panel support member 180 that is coupled to the image display panel 110 with the adhesive member 170 to surround the image display panel 110. The panel support member 180 further supports the 3D optical panel 140 that is coupled to the image display panel 110 with the panel coupling member 141 to allow the left side surface, the upper side surface and the right side surface of the 3D optical panel 140 to be exposed to the outside of the stereoscopic image display device. Therefore, a related art front set cover is removed, and thus, the thickness of the stereoscopic image display device is minimized. Moreover, the instrument material (Bezel) configuring the front border portion of the 3D optical panel 140 is removed, and thus, the aesthetic appearance of the stereoscopic image display device is enhanced in terms of design.

Figure 6:
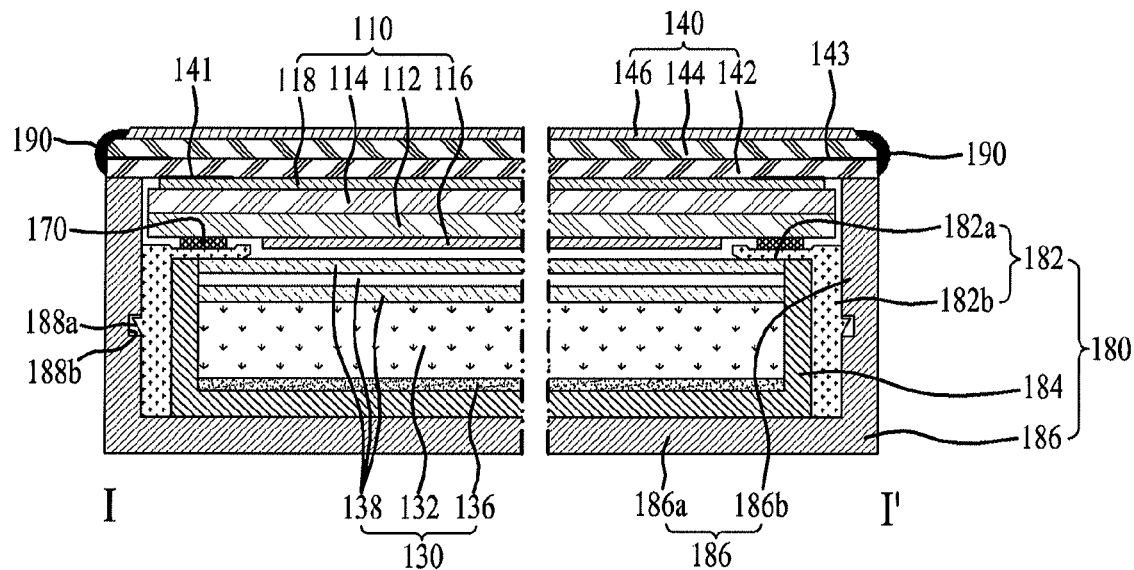
FIGS. 6 and 7 are views for describing a first embodiment of a modification example of the stereoscopic image display device according to the first embodiment of the present invention.
Figure 7:
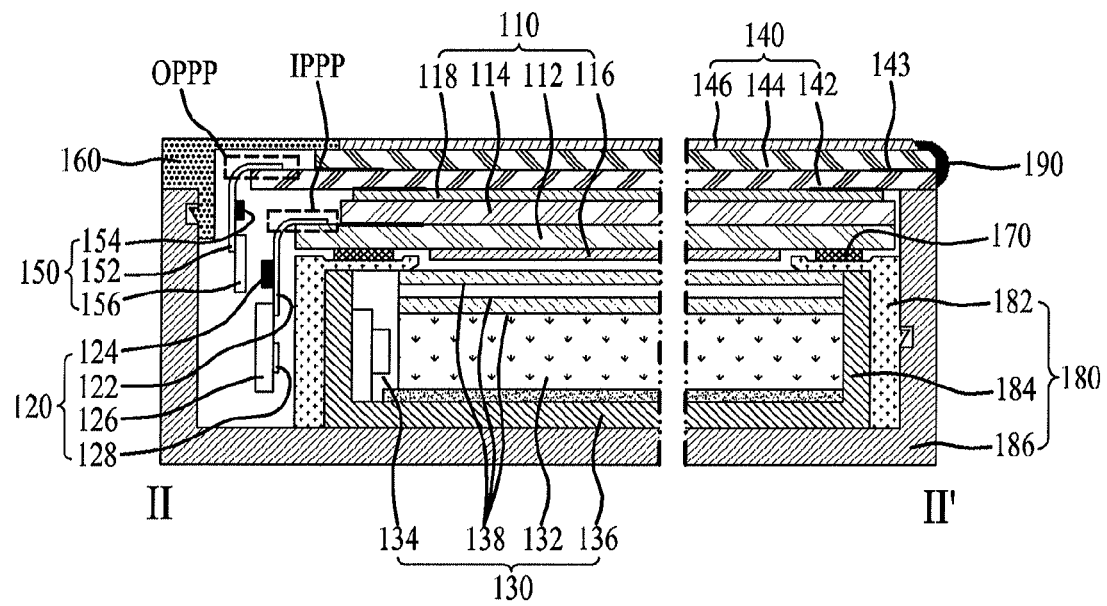

The stereoscopic image display device 100 according to the first embodiment of the present invention, as illustrated in FIGS. 6 and 7, may further include a panel protection member 190 that is formed at the exposed side surfaces of the 3D optical panel 140.

The panel protection member 190 is formed at three side surfaces of the 3D optical panel 140 except one side surface that is covered by the deco cover 160. That is, since the one side surface of the 3D optical panel 140 is covered by the deco cover 160, the panel protection member 190 is not required to be formed at the portion covered by the deco cover 160. The panel protection member 190 may be formed of a silicon-based sealant (resin) or an ultraviolet (UV)-setting sealant (resin), however, considering a process tack time, the panel protection member 190 may be formed of a UV-setting sealant. Also, the panel protection member 190 may be colorless (or transparent) or colored (for example, blue, red, or black), however, it is not limited thereto. Color of the panel protection member 190 may be selected according to the design of the stereoscopic image display device 100.

Figure 8:
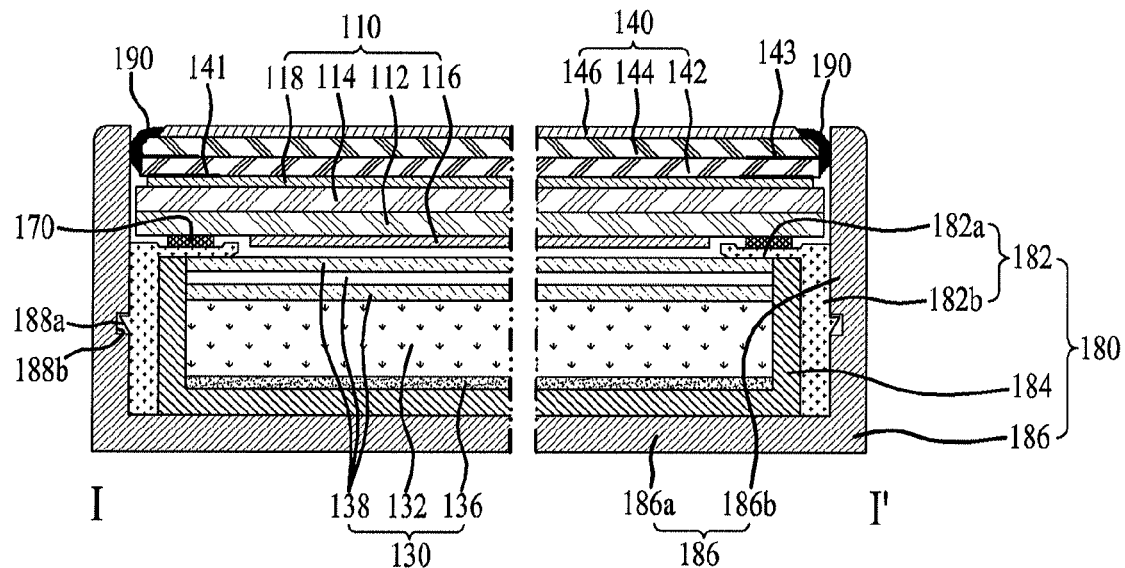
FIGS. 8 and 9 are views for describing a second embodiment of the modification example of the stereoscopic image display device according to the first embodiment of the present invention.
Figure 9:
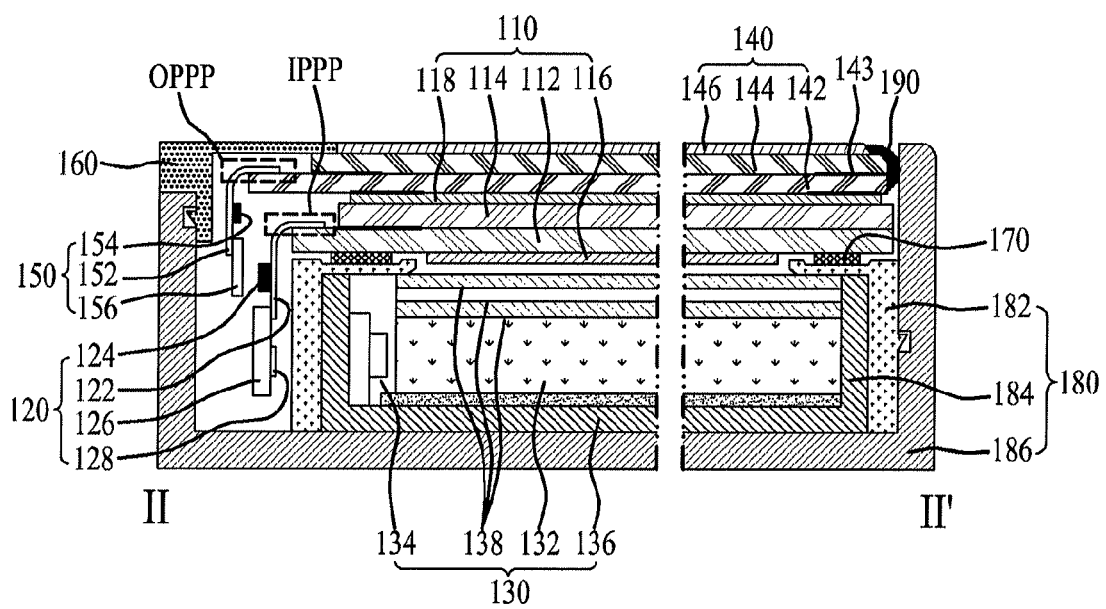

Moreover, in the panel support member 180 of the stereoscopic image display device 100 according to the first embodiment of the present invention, as illustrated in FIGS. 8 and 9, the set side wall 186b of the set cover 186 may be formed to surround the side surface of the 3D optical panel 140. That is, the set side wall 186b is formed to surround the guide frame 182, the image display panel 110, and the side surface of the 3D optical panel 140, or is formed to surround the side surface of the 3D optical panel 140 including the panel protection member 190, the guide frame 182, and the image display panel 110. In this case, the stereoscopic image display device 100 includes a border portion corresponding to the thickness of the set side wall 186b that surrounds the side surface of the 3D optical panel 140, and can firmly support the 3D optical panel 140 with the set side wall 186b.

Figure 10:
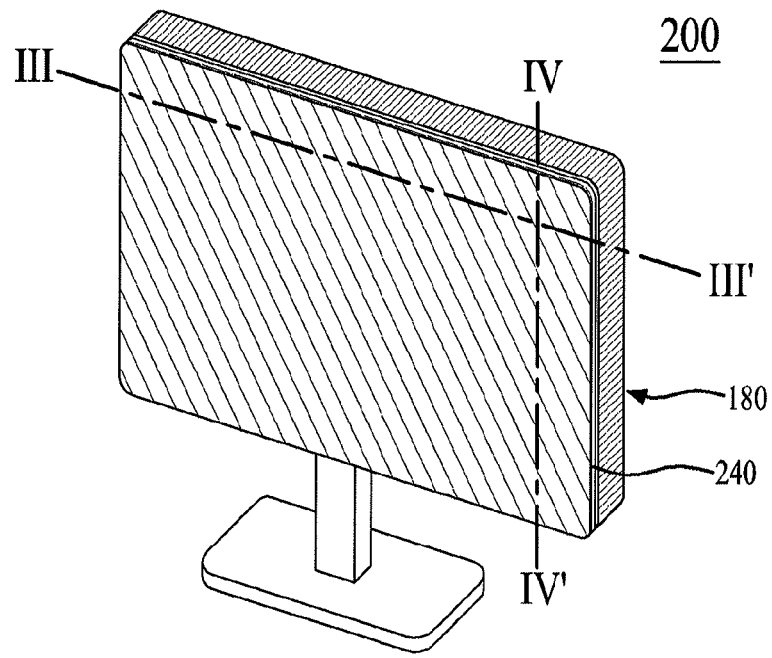
FIG. 10 is a view illustrating a stereoscopic image display device according to a second embodiment of the present invention.
Figure 11:
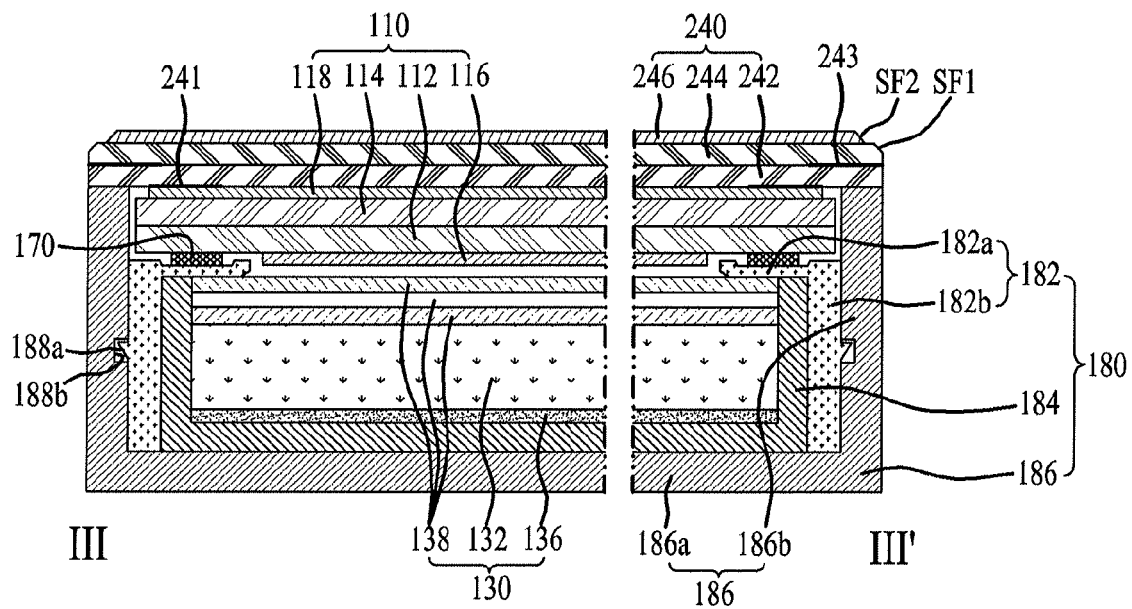
FIG. 11 is a sectional view taken along line III-III' of FIG. 10.
Figure 12:
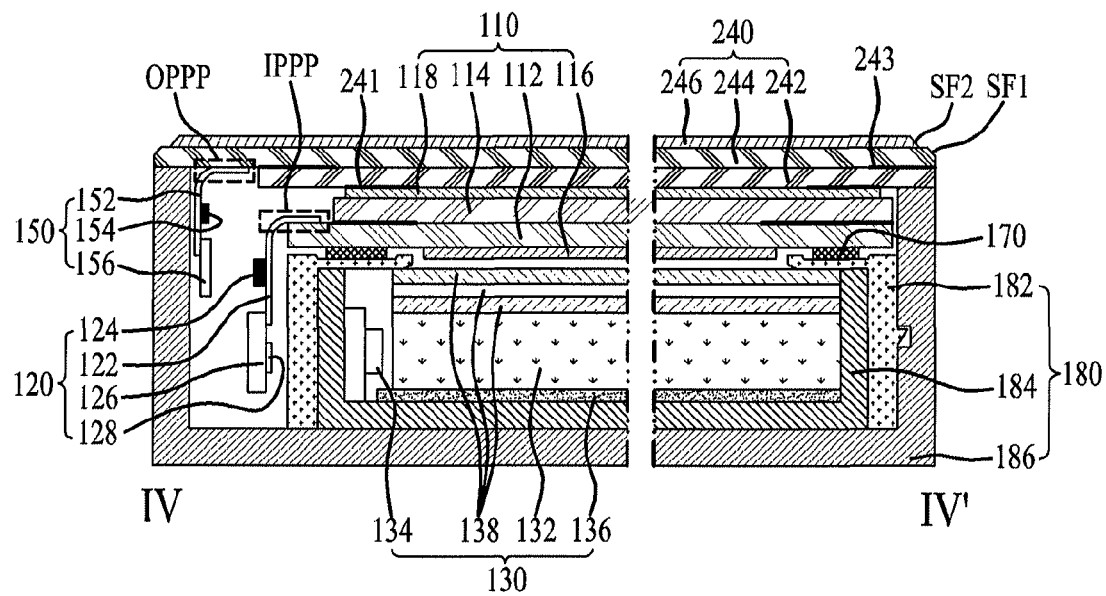
FIG. 12 is a sectional view taken along line IV-IV' of FIG. 10.

FIG. 10 is a view illustrating a stereoscopic image display device according to a second embodiment of the present invention. FIG. 11 is a sectional view taken along line III-III' of FIG. 10. FIG. 12 is a sectional view taken along line IV-IV' of FIG. 10.

Referring to FIGS. 10 to 12, a stereoscopic image display device 200 according to the second embodiment of the present invention is the same as the stereoscopic image display device 100 according to the first embodiment of the present invention, except that an entire top and four side surfaces of a 3D optical panel 240 are all exposed to the outside of the stereoscopic image display device. Therefore, a repetitive description is not made, and like reference numerals refer to like elements.

The 3D optical panel 240 divides light for a left-eye image and light for a right-eye image that are displayed and input by an image display panel 110 according to a liquid crystal driving signal, and is supported by a panel support member 180 such that the entire top and the four side surfaces are all exposed to the outside of the stereoscopic image display device. Therefore, the stereoscopic image display device 200 according to the second embodiment of the present invention may not include the deco cover 160 of the stereoscopic image display device 100 according to the first embodiment of the present invention, thereby further enhancing the aesthetic appearance of the front of the stereoscopic image display device 200.

Figure 13A:
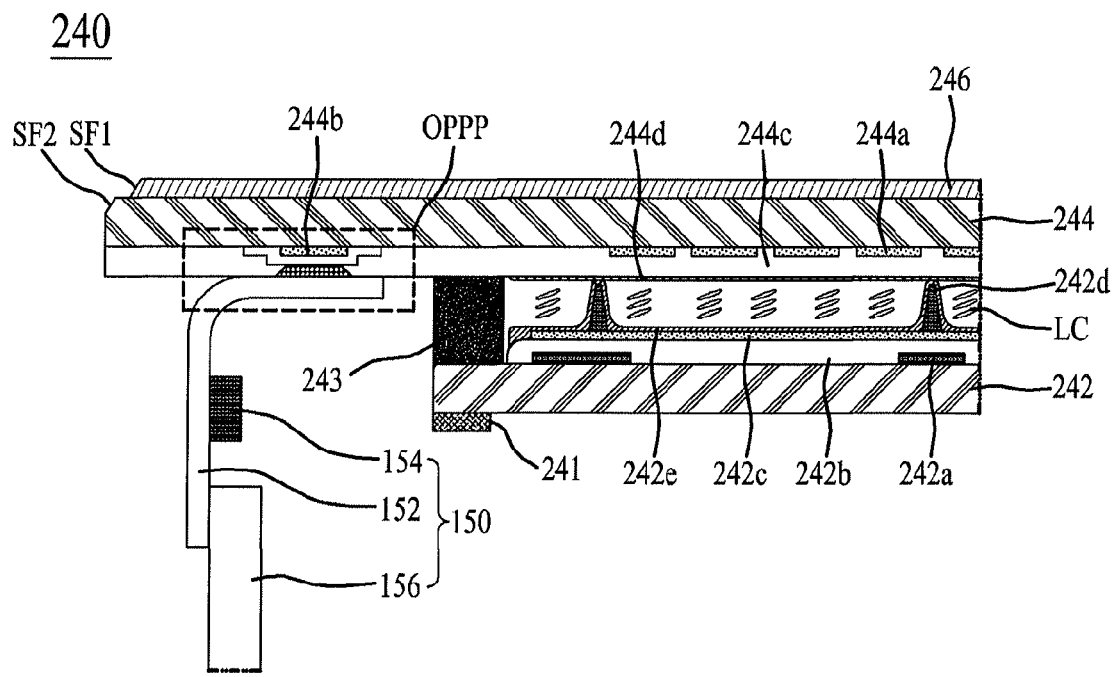
FIGS. 13A and 13B are views for describing various embodiments of a 3D optical panel of FIGS. 11 and 12.

The 3D optical panel 240 according to an embodiment, as illustrated in FIG. 13A, includes a lower substrate 242 and an upper substrate 244 that are coupled to each other with a liquid crystal layer LC for image division disposed therebetween. The 3D optical panel 240 further includes a polarization conversion member 246 disposed on the upper substrate 244.

The lower substrate 242 is formed to have an area larger than that of the image display panel 110, and adhered to an upper surface of the image display panel 110 with a panel coupling member 241. In this case, the panel coupling member 241 may be a double-sided tape, a thermosetting adhesive, or a photocurable adhesive that is disposed at an edge portion of a lower side of the lower substrate 242 and to be coupled to an edge portion of an upper surface of the upper polarizing film 118 of the image display panel 110. Herein, when the panel coupling member 241 is a transparent thermosetting adhesive or a transparent photocurable adhesive, the panel coupling member 241 may be disposed at an entire bottom of the lower substrate 242 to enhance a coupling strength.

The lower substrate 242 includes a light blocking pattern 242a, a lower insulation layer 242b, a transparent electrode layer 242c, a plurality of gap maintaining members 242d, and a lower alignment layer 242e.

The light blocking pattern 242a is formed at the lower substrate 242 to define an opening area corresponding to each pixel area.

The lower insulation layer 242b is formed on an entire surface of the lower substrate 242 to cover the light blocking pattern 242a.

The transparent electrode layer 242b is formed as one body. A reference voltage for driving the liquid crystal layer LC is supplied to the transparent electrode layer 242c.

The gap maintaining members 242d are formed on the transparent electrode layer 242c at a certain interval to have a certain height, and maintain a constant cell gap between the lower substrate 242 and the upper substrate 244.

The lower alignment layer 242e is formed to cover the gap maintaining members 242d and the transparent electrode layer 242c, and allows liquid crystal molecules of the liquid crystal layer LC to be aligned (oriented) in a certain direction.

The upper substrate 244 is formed to have a size larger than that of the lower substrate 242 to fully cover the lower substrate 242. That is, one side of the upper substrate 244 is extended to make the upper substrate 244 have a size larger than that of the lower substrate 242. Specifically, the lower side of the upper substrate 244 is extended. The upper substrate 244 includes a plurality of transparent electrode lines 244a, a plurality of pad electrodes 244b, an upper insulation layer 244c, and an upper alignment layer 244d.

Each of the transparent electrode lines 244a is formed on the upper substrate 244 in corresponding to a pixel area of the image display panel 110. Each of the transparent electrode lines 244a allows an electric field to be generated in the liquid crystal layer LC for image division and thus the liquid crystal layer LC for image division, can be driven according to a plurality of liquid crystal driving signals that are respectively supplied through the pad electrodes 244b.

Each of the pad electrodes 244b is formed at an optical panel pad part OPPP that is prepared at an edge portion of the lower side of the upper substrate 244, and electrically connected to a corresponding transparent electrode line 244a. The pad electrodes 244b are connected to the above-described optical panel driver 150, and supply the liquid crystal driving signals, which are supplied from the optical panel driver 150, to the transparent electrode lines 244a respectively.

The upper insulation layer 244c is formed at the upper substrate 244 to cover the transparent electrode lines 244a and the pad electrodes 244b.

The upper alignment layer 244d is formed on the upper insulation layer 244c to allow liquid crystal molecules of the liquid crystal layer LC to be aligned (oriented) in a certain direction.

The lower substrate 242 and upper substrate 244 of the 3D optical panel 240 according to an embodiment of the present invention are coupled to each other by a sealing member 243 that is formed at an edge portion of the upper surface of the lower substrate 242, with the liquid crystal layer LC for image division disposed therebetween.

The optical panel driver 150 is connected to the optical panel pad part OPPP that is prepared at an edge portion of the lower side of the lower surface of the upper substrate 244. The optical panel driver 150 is covered by the lower side of the upper substrate 244 without being exposed to the outside of the stereoscopic image display device.

An edge portion of the extended side of the upper substrate 244, namely, an edge portion of the lower side of the upper substrate 244 is supported by the set cover 186 of a panel support member 180, and an edge portion of the other sides of the 3D optical panel 240, namely, an edge portion of the other sides of the lower substrate 242 is supported by the set cover 186 of the panel support member 180. Therefore, an entire top and each side surface of the 3D optical panel 240 are exposed to the outside of the stereoscopic image display device without being surrounded by the panel support member 180.

The polarization conversion member 246 is disposed on an upper surface of the upper substrate 244, and converts left linear polarized light or right linear polarized light, which is divided and inputted by the liquid crystal layer LC for image division, into different polarized light. For this end, the polarization conversion member 246 may be a λ/4 wavelength plate having a phase difference of λ/4. For example, the polarization conversion member 246 converts left linear polarized light, which is incident thereon by the liquid crystal layer LC for image division, into right circular polarized light. In this way, a left-eye image presented by the light that has been left circular polarized by the polarization conversion member 246 is transferred to a viewer's left eye through 3D glasses having a circular polarization type, and a right-eye image presented by the light that has been right circular polarized by the polarization conversion member 146 is transferred to a viewer's right eye through the 3D glasses.

Similar to the first embodiment of the present invention, each side (including the lower side) of the upper substrate 244 and each side of the polarization conversion member 246 are processed to have first and second slope faces SF1 and SF2 with a certain slope, respectively, and each corner portion of the 3D optical panel 240 is rounded to have a certain curvature.

When 3D glasses have a linear polarization type, the polarization conversion member 246 may be omitted.

Figure 13B:
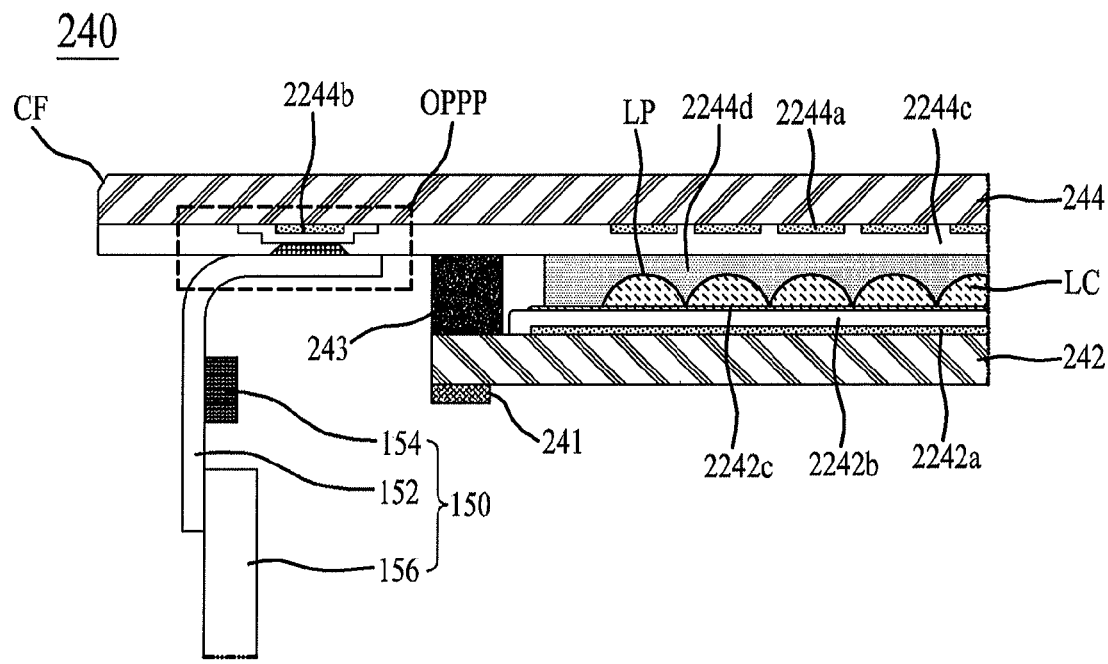

A 3D optical panel 240 according to another embodiment of the present invention, as illustrated in FIG. 13B, includes a lower substrate 242 and an upper substrate 244 that are coupled to each other with a liquid crystal layer LC for image division disposed therebetween, and a polarization conversion member 246.

The lower substrate 242 is formed to have an area larger than that of the image display panel 110, and adhered to an upper surface of the image display panel 110 with a panel coupling member 241. In this case, the panel coupling member 241 may be a double-sided tape, a thermosetting adhesive, or a photocurable adhesive that is disposed at an edge portion of a lower side of the lower surface of the lower substrate 242 and is overlapped with an edge portion of the corresponding side of the upper surface of the upper polarizing film 118 of the image display panel 110. Herein, when the panel coupling member 241 is a transparent thermosetting adhesive or a transparent photocurable adhesive, the panel coupling member 241 may be disposed at an entire bottom of the lower substrate 242 to enhance a coupling strength.

The lower substrate 242 includes a transparent electrode layer 2242a, a lower insulation layer 2242b, and a lower alignment layer 2242c.

The transparent electrode layer 2242a is formed as one body. A reference voltage for driving the liquid crystal layer LC for image division is supplied to the transparent electrode layer 2242a.

The lower insulation layer 2242b is formed on the lower substrate 242 to cover the transparent electrode layer 2242a.

The lower alignment layer 2232c is formed on the lower insulation layer 2242b to allow liquid crystal molecules of the liquid crystal layer LC to be aligned (oriented) in a certain direction.

The upper substrate 244 is formed to have a size larger than that of the lower substrate 242 to fully cover the lower substrate 242. That is, one side of the upper substrate 244 is extended to make the upper substrate 244 have a size larger than that of the lower substrate 242. Specifically, the lower side of the upper substrate 244 is extended. Also, an upper portion of the side surface of the upper substrate 244 is processed to have a slope face CF with a certain slope. The upper substrate 244 includes a plurality of transparent electrode lines 2244a, a plurality of pad electrodes 2244b, an upper insulation layer 2244c, and a lens pattern layer 2244d.

Each of the transparent electrode lines 2244a is formed on the upper substrate 244 in corresponding to a pixel area of the image display panel 110. Each of the transparent electrode lines 2244a allows an electric field to be generated in the liquid crystal layer LC for image division and thus the liquid crystal layer LC for image division, can be driven according to a plurality of liquid crystal driving signals that are respectively supplied through the pad electrodes 2244b.

Each of the pad electrodes 2244b is formed at an optical panel pad part OPPP that is prepared at an edge portion of the lower side of the upper substrate 244, and electrically connected to a corresponding transparent electrode line 2244a. The pad electrodes 2244b are connected to the above-described optical panel driver 150, and supply the liquid crystal driving signals, which are supplied from the optical panel driver 150, to the transparent electrode lines 2244a respectively.

The upper insulation layer 2244c is formed at the upper substrate 244 to cover the transparent electrode lines 2244a and the pad electrodes 2244b.

The lens pattern layer 2244d is formed on the upper insulation layer 2244c and includes a plurality of lens pattern grooves LP that are formed concavely in corresponding to the respective transparent electrode lines 2244a.

Each of the lens pattern grooves LP is formed to have a cross section of a concave shape, for example, a semicircular shape or oval shape. Herein, the sectional width of each lens pattern groove LP is used for dividing a left-eye image and a right-eye image that are spatially divided and displayed on the image display panel 110, and can be determined according to the number of viewers in front of the image display panel 110.

The lower substrate 242 and upper substrate 244 of the 3D optical panel 240 according to this embodiment are coupled to each other by a sealing member 243 that is formed at an edge portion of the upper surface of the lower substrate 242, with the liquid crystal layer LC for image division disposed therebetween.

The liquid crystal layer LC for image division is filled in each of the lens pattern grooves LP that is formed at the upper substrate 244. In this case, the liquid crystal molecules of the liquid crystal layer LC for image division are aligned (oriented) in a certain direction by the lower alignment layer 2242c that is formed at the lower substrate 242. The liquid crystal layer LC for image division is driven according to a plurality of liquid crystal driving signals which are respectively applied to the transparent electrode lines 2244a and the reference voltage which is applied to the transparent electrode layer 2242a, thereby dividing a left-eye image and a right-eye image.

The 3D optical panel 240 according to this embodiment divides a left-eye image and a right-eye image by using the lens pattern grooves LP, thereby providing a stereoscopic image to a viewer based on a glasses free type.

In the 3D optical panel 240 according to this embodiment, the optical panel driver 150 is connected to the optical panel pad part OPPP that is prepared at an edge portion of the lower side of the lower surface of the upper substrate 244. The optical panel pad part OPPP and the optical panel driver 150 are covered by the lower side of the upper substrate 244 without being exposed to the outside of the stereoscopic image display device.

An edge portion of the extended side of the upper substrate 244, namely, an edge portion of the lower side of the upper substrate 244 is supported by the set cover 186 of a panel support member 180, and an edge portion of the other sides of the 3D optical panel 240, namely, an edge portion of the other sides of the lower substrate 242 is supported by the set cover 186 of the panel support member 180. Therefore, an entire top and each side surface of the 3D optical panel 240 are exposed to the outside of the stereoscopic image display device without being surrounded by the panel support member 180.

In the stereoscopic image display device 200 according to the second embodiment of the present invention, the upper substrate 244 of the 3D optical panel 240 is formed to have a size larger than that of the lower substrate 242 of the 3D optical panel 240, and thus the upper surface and the four side surfaces of the 3D optical panel 240 are all exposed to the outside of the stereoscopic image display device. Accordingly, the stereoscopic image display device has an enhanced aesthetic appearance in terms of design.

Figure 14:
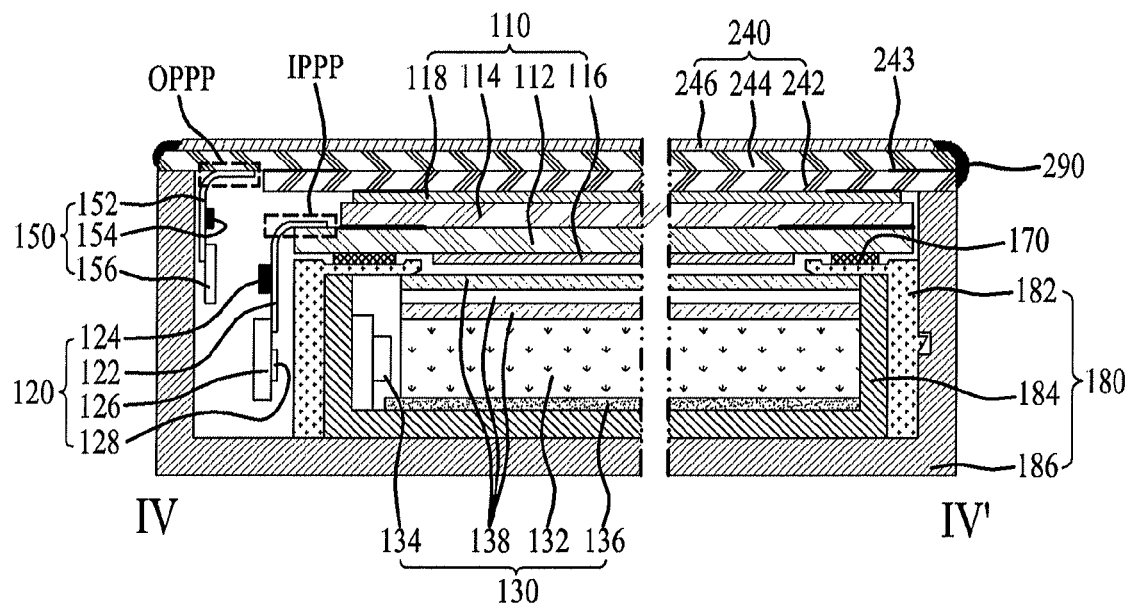
FIG. 14 is a view for describing a first embodiment of a modification example of the stereoscopic image display device according to the second embodiment of the present invention.

The stereoscopic image display device 200 according to the second embodiment of the present invention, as illustrated in FIG. 14, may further include a panel protection member 290 that is formed at the exposed side surfaces of the d 3D optical panel 140.

The panel protection member 290 is formed at four side surfaces of the 3D optical panel 240. The panel protection member 290 may be formed of a silicon-based sealant (resin) or a ultraviolet (UV)-setting sealant (resin), while considering a process tack time, the panel protection member 290 may be formed of a UV-setting sealant. Also, the panel protection member 290 may be colorless (or transparent) or colored (for example, blue, red, or black), however, it is not limited thereto. Color of the panel protection member 190 may be selected according to the design of the stereoscopic image display device 200.

Figure 15:
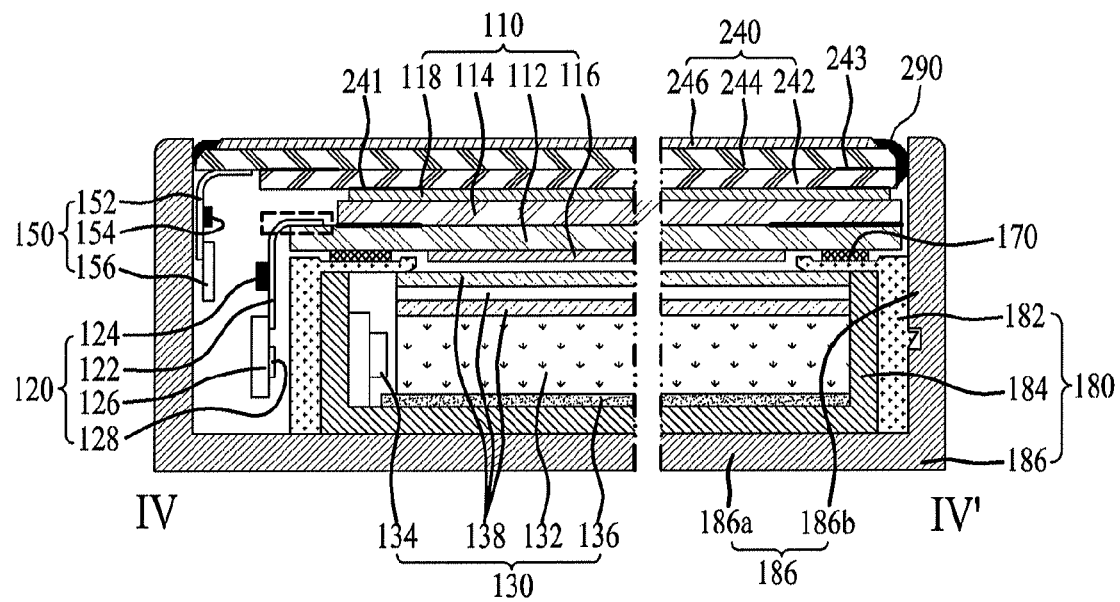
FIG. 15 is a view for describing a second embodiment of the modification example of the stereoscopic image display device according to the second embodiment of the present invention.

Moreover, in the panel support member 180 of the stereoscopic image display device 200 according to the second embodiment of the present invention, as illustrated in FIG. 15, the set side wall 186b of the set cover 186 may be formed to surround the side surface of the 3D optical panel 240. That is, the set side wall 186b is formed to surround the guide frame 182, the image display panel 110, and the side surface of the 3D optical panel 240, or is formed to surround the side surface of the 3D optical panel 240 including the panel protection member 290, the guide frame 182, and the image display panel 110. In this case, the stereoscopic image display device 200 includes a border portion corresponding to the thickness of the set side wall 186b that surrounds the side surface of the 3D optical panel 240, and can stably support the 3D optical panel 240 with the set side wall 186b.

Figure 16:
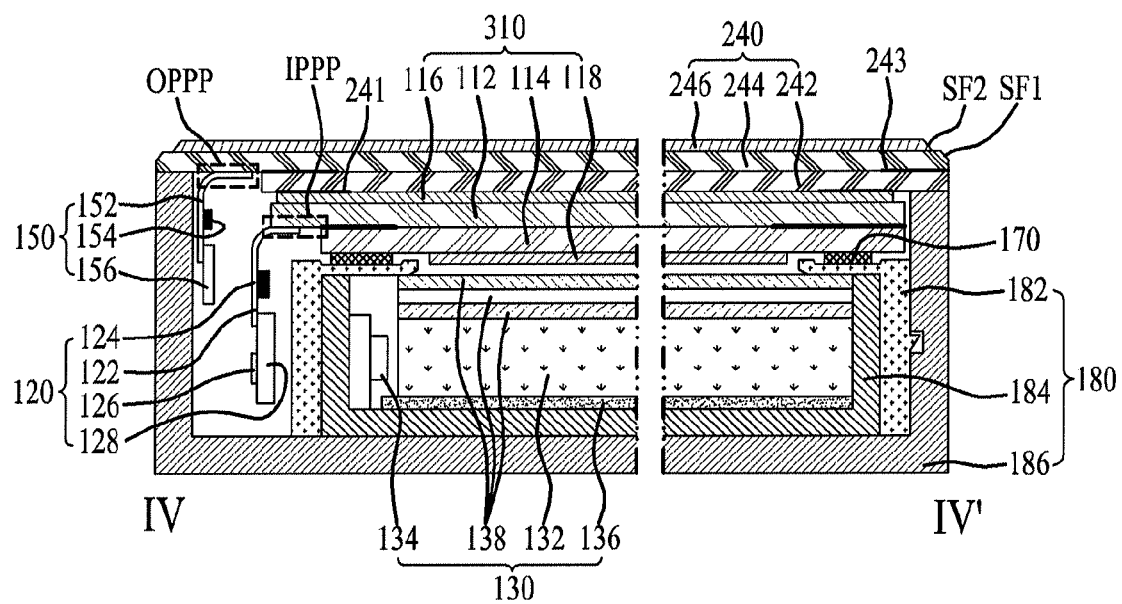
FIG. 16 is a view for describing a third embodiment of the modification example of the stereoscopic image display device according to the second embodiment of the present invention.

In the stereoscopic image display device 200 according to the second embodiment of the present invention, as illustrated in FIG. 16, the first and second substrates 112 and 114 may be vertically switched in disposed position, and coupled to the guide frame 182. In this case, a coupling area between the image display panel 110 and the 3D optical panel 240 increases, thus increasing a coupling strength between the image display panel 110 and the 3D optical panel 240.

Figure 17:
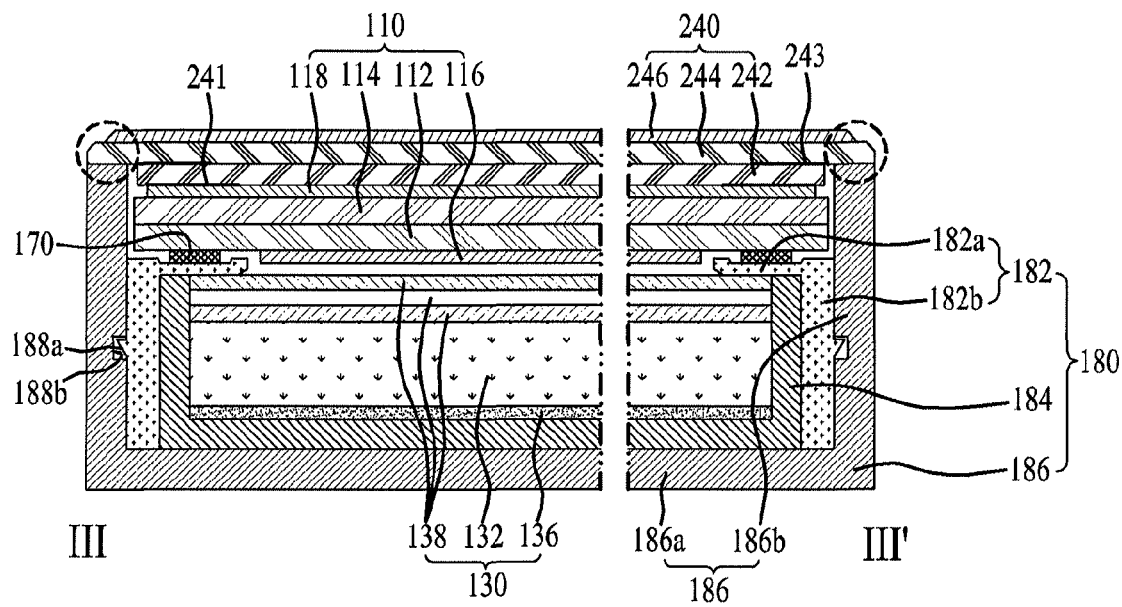
FIGS. 17 and 18 are views for describing a fourth embodiment of the modification example of the stereoscopic image display device according to the second embodiment of the present invention.
Figure 18:
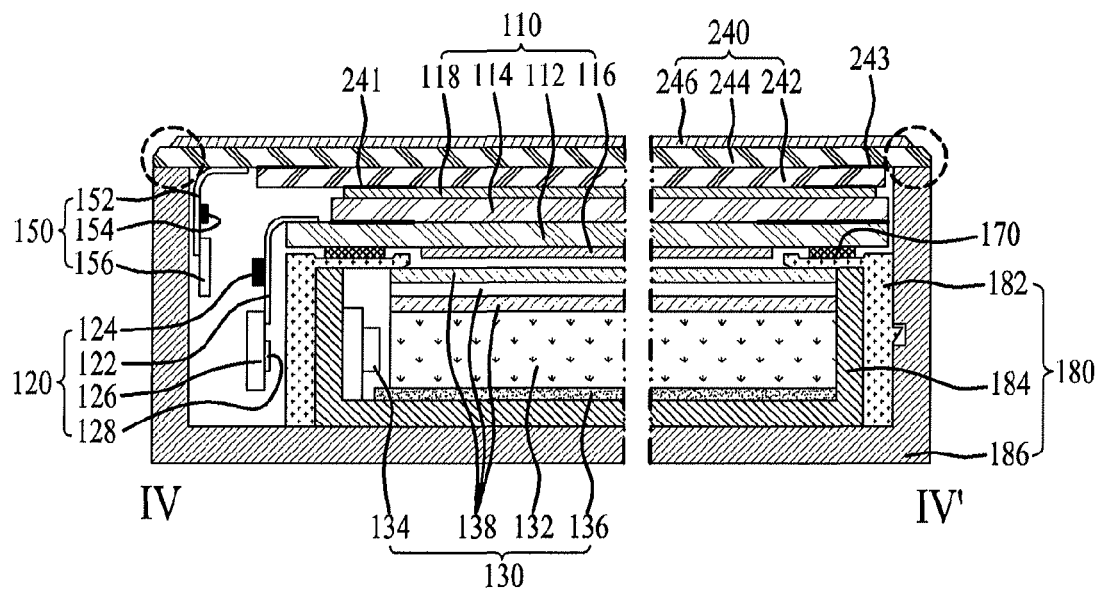

In the stereoscopic image display device 200 according to the second embodiment of the present invention, only one side of the upper substrate 244 of the 3D optical panel 240 has been described above as being extended, i.e., the lower side of the upper substrate 244 is extended, however, the present invention is not limited thereto. The other sides of the upper substrate 244 may also be extended. As illustrated in the dotted line circular portions in FIGS. 17 and 18, with respect to the lower substrate 242, the four sides of the upper substrate 244 are extended to such an extent that the four sides of the upper substrate 244 are longer than those of the lower substrate 242. In this case, the panel support member 180 supports an edge portion of lower surface of the enlarged upper substrate 244.

Figure 19:
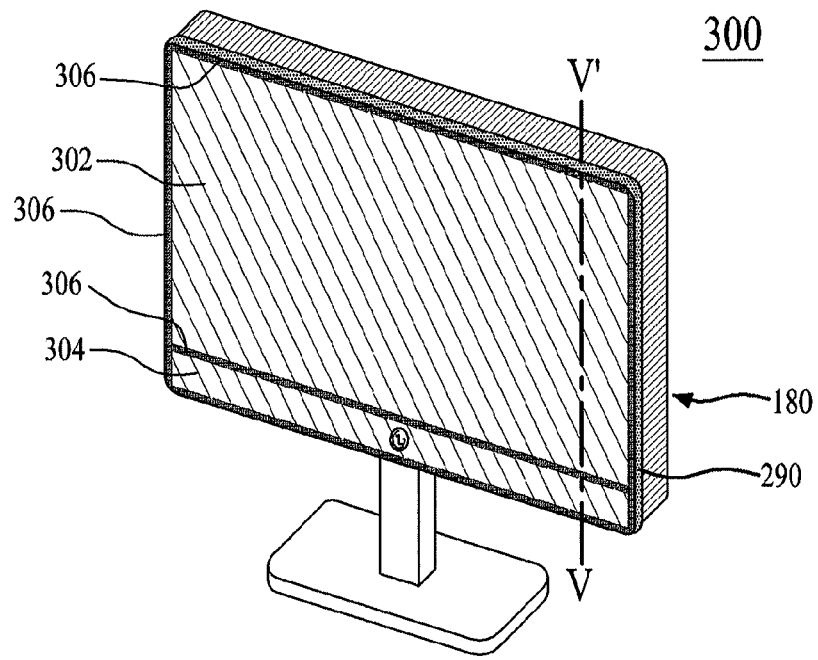
FIG. 19 is a view illustrating a stereoscopic image display device according to a third embodiment of the present invention.
Figure 20:
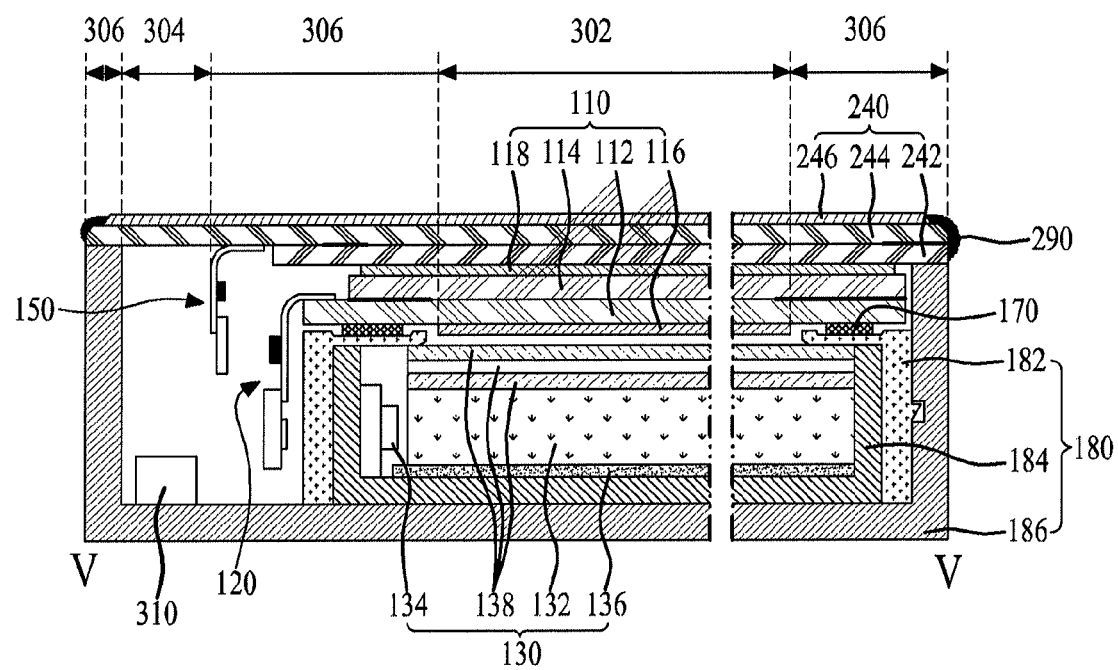
FIG. 20 is a sectional view taken along line V-V' of FIG. 19.

FIG. 19 is a view illustrating a stereoscopic image display device according to a third embodiment of the present invention. FIG. 20 is a sectional view taken along line V-V' of FIG. 19.

Referring to FIGS. 19 and 20, a stereoscopic image display device 300 according to the third embodiment of the present invention is the same as the stereoscopic image display device 200 according to the second embodiment of the present invention, except that the stereoscopic image display device 300 further includes a sub display part 310 that is placed in the panel support member 180 such that the sub display part 310 is overlapped with the enlarged upper substrate 244. Therefore, a repetitive description is not provided, and like reference numerals refer to like elements.

Specifically, the sub display part 310 is placed on the set cover 186 of the panel support member 180 to correspond to the enlarged portion of the enlarged upper substrate 244, and displays a sub image on a sub active area 304 that is formed by the enlarged portion of the enlarged upper substrate 244. Therefore, the stereoscopic image display device 300 may be divided into: a main active area 302 that corresponds to a display part of the image display panel 110; a sub active area 304 that is adjacent to the main active area 302 and corresponds to the sub display part 310; and a peripheral area 306 that surrounds the main active area 302 and the sub active area 304.

The main active area 302 is a main screen for displaying a main image such as a moving image, a still image, or a stereoscopic image according to the driving of the image display panel 110. The main active area 302 may have a screen resolution of at least one 1920×1080.

The sub active area 304 is a sub screen that is disposed below the main active area 302 and displays a sub image such as additional information including a letter, a sign, a figure, and a number according to the driving of the sub display part 310. Herein, the additional information may include a manufacturer logo for a stereoscopic image display device, advertisement, subtitles information on a moving image, sound volume information, channel information, and time information.

The peripheral area 306 is formed to surround the main active area 302 and the sub active area 304, and separates the main active area 302 from the sub active area 304.

The sub display part 310 may be configured with at least one of a light emitting diode display element, an organic light emitting display element, and a vacuum fluorescent display element. Instead of being placed on the set cover 186 of the panel support member 180, the sub display part 310 may be adhered to a lower surface of the enlarged portion of the enlarged upper substrate 244, and configured with a sticker that displays only a manufacturer logo for a stereoscopic image display device on the sub active area 304.

In the stereoscopic image display device 300 according to the third embodiment of the present invention, the upper substrate 244 of the 3D optical panel 240 is larger than the lower substrate 242, and thus, an entire upper surface and four side surfaces of the 3D optical panel 240 are all exposed to the outside of the stereoscopic image display device. Accordingly, the stereoscopic image display device has a more enhanced aesthetic appearance in terms of design.

Moreover, the stereoscopic image display device 300 according to the third embodiment of the present invention displays a stereoscopic image on the main active area 302 corresponding to the image display panel 110, and further displays a sub image on the sub active area 304 corresponding to the sub display part 310 that is adhered to the lower surface of the enlarged portion of the enlarged upper substrate 244, thereby providing a stereoscopic image as well as various additional information to a viewer.

The above description has been made on the stereoscopic image display device using a liquid crystal display device, however, the stereoscopic image display device according to the present invention may be a stereoscopic image display device using at least one of the various flat panel display devices such as an organic light emitting display device. For example, in an image display panel of a stereoscopic image display device using an organic light emitting display device, a plurality of organic light emitting elements are formed at a first substrate or a second substrate, and a panel driver connected to the first substrate drives the organic light emitting elements, whereby an image is displayed using the light that is radiated to the outside through the second substrate.

The stereoscopic image display device according to the present invention may be used as a display device for notebook computers, tablet computers, and various portable information devices, in addition to a display device or televisions and monitors.

As described above, the stereoscopic image display device according to the present invention includes the panel support member that is coupled to the image display panel with the adhesive member and supports the 3D optical panel in such a way that the upper surface and the side surface of the 3D optical panel are exposed to the outside of the stereoscopic image display device. Therefore, a related art front set cover is removed, and thus, the thickness of the stereoscopic image display device is minimized. Moreover, the instrument material (Bezel) configuring the front border portion of the 3D optical panel is removed, and thus, the aesthetic appearance of the front is enhanced in terms of design.

Moreover, in the stereoscopic image display device according to the present invention, the upper substrate of the 3D optical panel is enlarged, and the upper surface and each side surface of the 3D optical panel are all exposed to the outside of the stereoscopic image display device. Accordingly, the stereoscopic image display device has the more enhanced aesthetic appearance in terms of design.

Furthermore, in the stereoscopic image display device according to the present invention, the main active area corresponding to the image display panel displays a stereoscopic image, and the sub active area that is formed in the area corresponding to the enlarged portion of the enlarged substrate of the 3D optical panel displays a sub image, thus providing various additional information in addition to stereoscopic images to a viewer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A stereoscopic image display device, comprising:
   an image display panel dividing and displaying a left-eye image and a right-eye image;
   a 3D optical panel directly coupled to an upper surface of a second substrate of the image display panel using a panel coupling member, and dividing the left-eye image and the right-eye image; and
   a panel support member coupled directly to a back surface of a first substrate of the image display panel using an adhesive member to surround the image display panel,
   wherein the 3D optical panel is supported by the panel support member such that an upper surface of the 3D optical panel is exposed to the outside of the stereoscopic image display device, and
   wherein the upper surface of the second substrate of the image display panel and the upper surface of the 3D optical panel are not covered by the panel support member.

2. The stereoscopic image display device of claim 1, wherein the 3D optical panel comprises:
   a lower substrate directly coupled to the upper surface of the second substrate the image display panel with the panel coupling member, and comprising a transparent electrode layer;
   an upper substrate coupled to the lower substrate, and comprising a plurality of transparent electrode lines; and
   a liquid crystal layer formed between the lower substrate and the upper substrate,
   wherein the liquid crystal layer is driven according to a liquid crystal driving signal supplied to each of the transparent electrode lines thereby divides the left-eye image and the right-eye image.

3. The stereoscopic image display device of claim 2, wherein the 3D optical panel further comprises a polarization conversion member coupled to the upper surface of the upper substrate,
   wherein the polarization conversion member is a λ/4 wavelength plate having a phase difference of λ/4.

4. The stereoscopic image display device of claim 2, further comprising an optical panel driver connected to an optical panel pad part which is at an edge portion of the upper substrate, so as to be connected to the transparent electrode lines, the optical panel driver being surrounded by the panel support member.

5. The stereoscopic image display device of claim 4, wherein,
   the upper substrate has a size which covers the optical panel driver and the lower substrate, and is supported by the panel support member, and
   wherein each side of the upper substrate is exposed to the outside of the stereoscopic image display device.

6. The stereoscopic image display device of claim 4, wherein,
   one side of the upper substrate extends to cover the optical panel driver, and
   the panel support member supports an edge portion of the lower surface of the lower substrate and an edge portion of the lower surface of the enlarged portion of the upper substrate, such that each side surface of the upper substrate and each side surface of the lower substrate are exposed externally.

7. The stereoscopic image display device of claim 2, further comprising a sub-display part placed in the panel support member,
   wherein one side of the upper substrate extends to prevent the sub display part from being exposed to the outside of the stereoscopic image display device, the edge portion of the extended side of the upper substrate being supported by the panel support member.

8. The stereoscopic image display device of claim 1, wherein the 3D optical panel comprises:
   a lower substrate directly coupled to the upper surface of the image display panel with the panel coupling member, and comprising a transparent electrode layer;
   an upper substrate coupled to the lower substrate, and comprising a plurality of transparent electrode lines and a plurality of lens pattern grooves which are respectively overlapped with the transparent electrode lines; and
   a liquid crystal layer filled in each of the lens pattern grooves,
   wherein the liquid crystal layer is driven according to a liquid crystal driving signal supplied to each of the transparent electrode lines thereby divides the left-eye image and the right-eye image.

9. The stereoscopic image display device of claim 8, further comprising an optical panel driver connected to an optical panel pad part which is at an edge portion of the upper substrate, so as to be connected to the transparent electrode lines, the optical panel driver being surrounded by the panel support member.

10. The stereoscopic image display device of claim 1, wherein,
    the 3D optical panel comprises a lower substrate and an upper substrate coupled to each other with a liquid crystal layer disposed therebetween, the liquid crystal layer being driven to divide the left-eye image and the right-eye image according to a liquid crystal driving signal, the upper substrate having a size which covers the lower substrate, and
    the panel support member supporting an edge portion of the lower surface of the 3D optical panel or surrounding each side of the 3D optical panel.

11. The stereoscopic image display device of claim 1, wherein the 3D optical panel comprises:
    a lower upper substrate directly coupled to the upper surface of the image display panel with the panel coupling member, and comprising a plurality of transparent electrode lines;
    an upper substrate coupled to the lower substrate, and comprising a transparent electrode layer; and
    a liquid crystal layer formed between the lower substrate and the upper substrate, wherein the liquid crystal layer is driven according to a liquid crystal driving signal supplied to each of the transparent electrode lines, thereby divides the left-eye image and the right-eye image.

12. The stereoscopic image display device of claim 11, wherein the 3D optical panel further comprises a polarization conversion member coupled to the upper surface of the upper substrate,
wherein the polarization conversion member is a λ/4 wavelength plate having a phase difference of λ/4.

13. The stereoscopic image display device of claim 1, wherein the 3D optical panel comprises:
a lower substrate directly coupled to the upper surface of the image display panel with the panel coupling member, and comprising a plurality of transparent electrode lines;
an upper substrate coupled to the lower substrate, and comprising a transparent electrode layer and a plurality of lens pattern grooves which are respectively overlapped with the transparent electrode lines; and
a liquid crystal layer filled in each of the lens pattern grooves, wherein the liquid crystal layer is driven according to a liquid crystal driving signal supplied to each of the transparent electrode lines, thereby divides the left-eye image and the right-eye image.

14. The stereoscopic image display device of claim 11, further comprising:
an optical panel driver connected to an optical panel pad part which is at an edge portion of a lower side of the lower substrate, so as to be connected to the transparent electrode lines; and
a deco cover coupled to the panel support member to surround an edge portion of a lower side of the 3D optical panel where the optical panel pad part is prepared and under which the optical panel driver is located.

15. The stereoscopic image display device of claim 14, wherein,
the lower substrate is covered by the upper substrate of the 3D optical panel and the deco cover, and
the deco cover surrounds the lower side of the 3D optical panel.

16. The stereoscopic image display device of claim 15, wherein the panel support member supports an edge portion of the 3D optical panel or surrounds side surfaces of the 3D optical panel which are not surrounded by the deco cover among the side surfaces of the 3D optical panel.

17. The stereoscopic image display device of claim 1, wherein,
the 3D optical panel comprises a lower substrate and an upper substrate coupled to each other with a liquid crystal layer disposed therebetween, the liquid crystal layer being driven to divide the left-eye image and the right-eye image according to a liquid crystal driving signal, the lower substrate having a size which covers the upper substrate, and
the panel support member supporting an edge portion of a lower surface of the 3D optical panel or surrounding and supporting each side surface of the 3D optical panel.

18. The stereoscopic image display device of claim 1, wherein the panel support member comprises:
a guide frame directly coupled to an edge portion of the lower surface of the image display panel with the adhesive member; and
a set cover receiving the guide frame and the image display panel, and supporting an edge portion of the 3D optical panel or surrounding and supporting each side surface of the 3D optical panel,
wherein the upper surface of the image display panel is not covered by the guide frame.

19. The stereoscopic image display device of claim 1, further comprising a panel protection member directly formed at a side surface of the 3D optical panel.

20. The stereoscopic image display device of claim 19, wherein the panel protection member is surrounded by the panel support member.

* * * * *